(12) United States Patent
Coakley et al.

(10) Patent No.: US 11,791,577 B2
(45) Date of Patent: Oct. 17, 2023

(54) FORMING CONNECTIONS TO FLEXIBLE INTERCONNECT CIRCUITS

(71) Applicant: CelLink Corporation, San Carlos, CA (US)

(72) Inventors: Kevin Michael Coakley, Belmont, CA (US); Emily Hernandez, Belmont, CA (US); Mark Terlaak, San Carlos, CA (US); Malcolm Parker Brown, Mountain View, CA (US)

(73) Assignee: CelLink Corporation, San Carlos, CA (US)

( * ) Notice: Subject to any disclaimer, the term of this patent is extended or adjusted under 35 U.S.C. 154(b) by 147 days.

(21) Appl. No.: 17/492,483

(22) Filed: Oct. 1, 2021

(65) Prior Publication Data

US 2022/0109258 A1    Apr. 7, 2022

Related U.S. Application Data

(60) Provisional application No. 63/165,582, filed on Mar. 24, 2021, provisional application No. 63/086,876, filed on Oct. 2, 2020.

(51) Int. Cl.
*H01R 13/24* (2006.01)
*H01R 12/70* (2011.01)
*H01R 12/71* (2011.01)

(52) U.S. Cl.
CPC ..... *H01R 12/7047* (2013.01); *H01R 12/7064* (2013.01); *H01R 12/714* (2013.01); *H01R 12/716* (2013.01)

(58) Field of Classification Search
CPC ............ H01R 12/7047; H01R 12/7064; H01R 12/714; H01R 12/716; H01R 4/029;
(Continued)

(56) References Cited

U.S. PATENT DOCUMENTS 3,750,278 A    8/1973  Oberg et al.
4,740,867 A    4/1988  Roberts et al.
(Continued)

FOREIGN PATENT DOCUMENTS

CN    203715762 U    7/2014
EP    3496180 A1    6/2019
(Continued)

OTHER PUBLICATIONS

International Application Serial No. PCT/US21/52385, Search Report and Written Opinion dated Dec. 2, 2021, 7 pgs.
(Continued)

*Primary Examiner* — Peter G Leigh
*Assistant Examiner* — Nelson R. Burgos-Guntin
(74) *Attorney, Agent, or Firm* — Polygon IP, LLP

(57) ABSTRACT

Described herein are circuit assemblies comprising flexible interconnect circuits and/or other components connected to these circuits. In some examples, conductive elements of different circuits are connected with support structures, such as rivets. Furthermore, conductive elements of the same circuit can be interconnected. In some examples, a conductive element of a circuit is connected to a printed circuit board (or other devices) using a conductor-joining structure. Interconnecting different circuits involves stacking these circuits such that the conductive element in one circuit overlaps with the conductive element in another circuit. A support structure protrudes through both conductive elements and any other components positioned in between, such as dielectric and/or adhesive layers. This structure electrically connects the conductive elements and also compresses the conductive elements toward each other. For example, a rivet is used with the rivet heads contacting one or two conductive elements, e.g., directly interfacing their outer-facing sides.

20 Claims, 18 Drawing Sheets

(58) Field of Classification Search
CPC ...... H01R 12/592; H01R 12/62; H01R 12/65; H01R 12/7041; H01R 12/777; H01R 13/44; H01R 2201/26; H01R 12/613; H01R 4/06
See application file for complete search history.

(56) References Cited

U.S. PATENT DOCUMENTS

| | | | |
|---|---|---|---|
| 4,818,840 A | 4/1989 | Booth et al. | |
| 5,072,520 A * | 12/1991 | Nelson | H05K 3/4007 29/877 |
| 5,123,849 A * | 6/1992 | Deak | H01R 12/714 439/91 |
| 5,144,412 A * | 9/1992 | Chang | H05K 7/1084 361/783 |
| 5,161,093 A * | 11/1992 | Gorczyca | H01L 21/4857 257/E23.173 |
| 5,262,594 A | 11/1993 | Edwin et al. | |
| 5,350,319 A | 9/1994 | Roberts | |
| 5,382,759 A * | 1/1995 | Kei Lau | H05K 3/4647 174/254 |
| 5,452,182 A * | 9/1995 | Eichelberger | H01L 21/67144 361/764 |
| 5,509,200 A * | 4/1996 | Frankeny | H05K 3/445 174/266 |
| 5,631,446 A * | 5/1997 | Quan | H01R 12/772 174/254 |
| 5,645,932 A | 7/1997 | Uchibori | |
| 5,747,358 A * | 5/1998 | Gorrell | H05K 3/4007 29/830 |
| 5,825,633 A * | 10/1998 | Bujalski | H05K 3/368 439/82 |
| 6,010,771 A | 1/2000 | Isen et al. | |
| 6,020,257 A * | 2/2000 | Leedy | G03F 7/70483 438/626 |
| 6,036,809 A | 3/2000 | Kelly et al. | |
| 6,232,157 B1* | 5/2001 | Dodabalapur | H01L 27/1203 257/E21.538 |
| 6,332,909 B1 | 12/2001 | Teshima et al. | |
| 6,464,532 B1 | 10/2002 | L'Abbate et al. | |
| 6,787,732 B1 | 9/2004 | Xuan et al. | |
| 6,830,460 B1* | 12/2004 | Rathburn | H05K 3/326 439/66 |
| 6,881,923 B2 | 4/2005 | Battaglia | |
| 6,992,001 B1 | 1/2006 | Lin | |
| 7,144,256 B2 | 12/2006 | Pabst et al. | |
| 7,232,334 B2 | 6/2007 | Shimizu et al. | |
| 7,497,004 B2 | 3/2009 | Cote et al. | |
| 7,633,035 B2 | 12/2009 | Kirmeier | |
| 8,510,934 B2 | 8/2013 | Brand et al. | |
| 8,931,166 B2 | 1/2015 | Marttila | |
| 9,214,607 B1 | 12/2015 | Andrews | |
| 9,276,336 B2* | 3/2016 | Rathburn | H01R 12/52 |
| 9,350,093 B2* | 5/2016 | Rathburn | H01R 12/52 |
| 9,671,352 B2 | 6/2017 | Woo et al. | |
| 9,692,030 B2 | 6/2017 | Schüssler et al. | |
| 9,730,333 B2 | 8/2017 | Li et al. | |
| 10,008,403 B2 | 6/2018 | Rumsby | |
| 11,404,836 B2 | 8/2022 | Peterson et al. | |
| 2001/0006766 A1 | 7/2001 | O'Brien et al. | |
| 2002/0046856 A1 | 4/2002 | Alcoe | |
| 2002/0050489 A1 | 5/2002 | Ikegami et al. | |
| 2003/0062347 A1 | 4/2003 | Song et al. | |
| 2003/0223535 A1* | 12/2003 | Leedy | H01L 25/50 257/E21.705 |
| 2004/0029411 A1* | 2/2004 | Rathburn | H01R 12/79 257/E23.068 |
| 2004/0252477 A1* | 12/2004 | Brown | H01L 24/05 361/830 |
| 2004/0253845 A1* | 12/2004 | Brown | H01R 13/2492 257/E23.078 |
| 2004/0253846 A1* | 12/2004 | Brown | H01L 24/72 257/E23.078 |
| 2004/0253875 A1* | 12/2004 | Brown | H01R 12/52 439/620.14 |
| 2005/0051841 A1* | 3/2005 | Leedy | H01L 23/5381 257/E21.705 |
| 2005/0164527 A1* | 7/2005 | Radza | H01R 13/2492 257/E23.078 |
| 2005/0269693 A1* | 12/2005 | Green | H05K 3/366 257/723 |
| 2006/0032665 A1 | 2/2006 | Ice | |
| 2006/0116004 A1* | 6/2006 | Rathburn | H01R 13/2435 439/66 |
| 2007/0171129 A1 | 7/2007 | Coleman et al. | |
| 2007/0193027 A1 | 8/2007 | Takakusaki et al. | |
| 2008/0017971 A1 | 1/2008 | Hollis | |
| 2008/0083715 A1 | 4/2008 | Kirmeier | |
| 2008/0128397 A1 | 6/2008 | Gandhi | |
| 2008/0274654 A1* | 11/2008 | Yasumura | H01R 12/79 439/862 |
| 2009/0007421 A1 | 1/2009 | Chen et al. | |
| 2010/0031996 A1 | 2/2010 | Basol | |
| 2011/0001670 A1 | 1/2011 | Coleman et al. | |
| 2011/0089212 A1 | 4/2011 | Schmid et al. | |
| 2012/0164490 A1 | 6/2012 | Itoi et al. | |
| 2012/0171527 A1 | 7/2012 | Hiroma | |
| 2012/0227907 A1 | 9/2012 | Arakawa et al. | |
| 2013/0055555 A1 | 3/2013 | Forster et al. | |
| 2013/0260191 A1 | 10/2013 | Takahashi et al. | |
| 2014/0268780 A1 | 9/2014 | Wang et al. | |
| 2015/0023584 A1 | 1/2015 | Rudin | |
| 2015/0126049 A1* | 5/2015 | Lhommeau | H01R 12/592 439/67 |
| 2015/0173183 A1 | 6/2015 | Holec et al. | |
| 2015/0228956 A1 | 8/2015 | Schüssler et al. | |
| 2015/0270190 A1 | 9/2015 | Kim et al. | |
| 2016/0181579 A1 | 6/2016 | Geshi et al. | |
| 2016/0207287 A1 | 7/2016 | Kim | |
| 2016/0225969 A1* | 8/2016 | Coakley | H05K 1/0209 |
| 2016/0315304 A1 | 10/2016 | Biskup | |
| 2016/0366768 A1 | 12/2016 | Matsuda | |
| 2017/0012331 A1 | 1/2017 | Ng et al. | |
| 2017/0077487 A1* | 3/2017 | Coakley | H01M 50/503 |
| 2017/0214033 A1 | 7/2017 | Takano et al. | |
| 2018/0034023 A1 | 2/2018 | Newman et al. | |
| 2018/0205048 A1 | 7/2018 | Enomoto et al. | |
| 2018/0294536 A1 | 10/2018 | Kruszelnicki | |
| 2019/0045625 A1* | 2/2019 | Kong | H05K 1/0225 |
| 2019/0097204 A1 | 3/2019 | Liposky et al. | |
| 2019/0181419 A1 | 6/2019 | Suba et al. | |
| 2019/0218142 A1 | 7/2019 | Logunov et al. | |
| 2019/0296281 A1 | 9/2019 | Elsberry | |
| 2019/0312251 A1 | 10/2019 | Matthews | |
| 2019/0341585 A1 | 11/2019 | Shi et al. | |
| 2020/0137882 A1 | 4/2020 | Coakley et al. | |
| 2020/0220120 A1 | 7/2020 | Day et al. | |
| 2021/0257758 A1* | 8/2021 | Di Stefano | H01L 24/73 |
| 2022/0109258 A1* | 4/2022 | Coakley | H01R 12/7064 |

FOREIGN PATENT DOCUMENTS

| | | |
|---|---|---|
| GB | 2014368 A | 8/1979 |
| JP | 3970547 B2 | 9/2007 |
| KR | 20150058939 A | 5/2015 |
| RU | 2072119 C1 | 1/1997 |
| RU | 2476964 C2 | 2/2013 |
| WO | 2019150740 A1 | 8/2019 |

OTHER PUBLICATIONS

International Application Serial No. PCT/US21/53243, Search Report and Written Opinion dated Nov. 25, 2021, 8 pgs.
U.S. Appl. No. 17/487,652, Non Final Office Action dated Apr. 6, 2023, 14 pgs.

(56) References Cited

OTHER PUBLICATIONS

Nagarajan Palavesam et al; "Roll-to-roll processing of film substrates for hybrid integrated flexible electronics" Flexible and Printed Electronics, Feb. 2018.

* cited by examiner

FORMING CONNECTIONS TO FLEXIBLE INTERCONNECT CIRCUITS

CROSS-REFERENCE TO RELATED APPLICATIONS

This application claims the benefit under 35 U.S.C. § 119(e) of U.S. Provisional Patent Application 63/086,876, filed on 2020 Oct. 2 and U.S. Provisional Patent Application 63/165,582, filed on 2021 Mar. 24, both of which are incorporated herein by reference in their entirety for all purposes.

BACKGROUND

Electrical power and control signals are typically transmitted to individual components of a vehicle or any other machinery or system using multiple wires bundled together in a harness. In a conventional harness, each wire may have a round cross-sectional profile and be individually surrounded by an insulating sleeve. The cross-sectional size of each wire is selected based on the wire material and the current transmitted by this wire. Furthermore, resistive heating within the wire and thermal dissipation from the wire to the surroundings are two major considerations, often requiring large wires in a conventional harness. Furthermore, interconnecting wires in a harness and forming external connections to the harness often use bulky and heavy connectors. Yet, automotive, aerospace and other industries strive for smaller, lighter, and less expensive components.

What is needed are flexible interconnect circuits providing more efficient connections among different electric and electronic components and also methods of forming connections to these flexible interconnect circuits.

SUMMARY

Described herein are circuit assemblies comprising flexible interconnect circuits and/or other components connected to these circuits. In some examples, conductive elements of different circuits are connected with support structures, such as rivets. Furthermore, conductive elements of the same circuit can be interconnected. In some examples, a conductive element of a circuit is connected to a printed circuit board (or other devices) using a conductor-joining structure. Interconnecting different circuits involves stacking these circuits such that the conductive element in one circuit overlaps with the conductive element in another circuit. A support structure protrudes through both conductive elements and any other components positioned in between, such as dielectric and/or adhesive layers. This structure electrically connects the conductive elements and also compresses the conductive elements toward each other. For example, a rivet is used with the rivet heads contacting one or two conductive elements, e.g., directly interfacing their outer-facing sides.

DETAILED DESCRIPTION

In the following description, numerous specific details are outlined to provide a thorough understanding of the presented concepts. In some examples, the presented concepts are practiced without some or all of these specific details. In other examples, well-known process operations have not been described in detail to unnecessarily obscure the described concepts. While some concepts will be described in conjunction with the specific examples, it will be understood that these examples are not intended to be limiting.

Circuit Assembly Examples

Flexible interconnect circuits comprise one or more conductive elements, which are formed by patterning metal sheets and which may be referred to as conductors or conductive leads. For example, all conductive elements on the same level (along the circuit thickness) may be formed from the same metal sheet using, e.g., etching, die-cutting, and the like. In some examples, conductive elements are arranged into multiple levels forming flexible multilayered interconnect circuits. Such conductive elements have rectangular cross-sectional profiles and have various benefits over conventional round wires, such as small thickness and better heat dissipation. However, forming large interconnect circuits, especially circuits extending in two dimensions require large metal sheets, driving up the costs of these circuits. Significant portions of these metal sheets may be removed during patterning and forming conductive traces. Furthermore, handling large two-dimensional circuits may be challenging. Finally, unlike round wires, wide flat interconnect circuits may have limited in-plane bendability.

These issues can be addressed by circuit assemblies formed from multiple flexible interconnect circuits. Instead of forming one large two-dimensional circuit, multiple narrow-width circuits may be individually formed and later connected as needed. More specifically, conductive elements of these circuits are interconnected as needed. In some examples, conductive elements of the same circuit can be interconnected. Furthermore, conductive elements of a circuit can be connected to other components, such as printed circuit boards, electronic control units, and the like.

When interconnecting multiple flexible interconnect circuits into circuit assemblies, these circuit assemblies allow unique electrical connections among conductive elements that are not possible or difficult within a single flexible interconnect circuit. For example, connecting two conductive elements separated by another conductive element, which needs to remain electrically insulated from these two conductive elements, may be difficult.

Figure 1A:
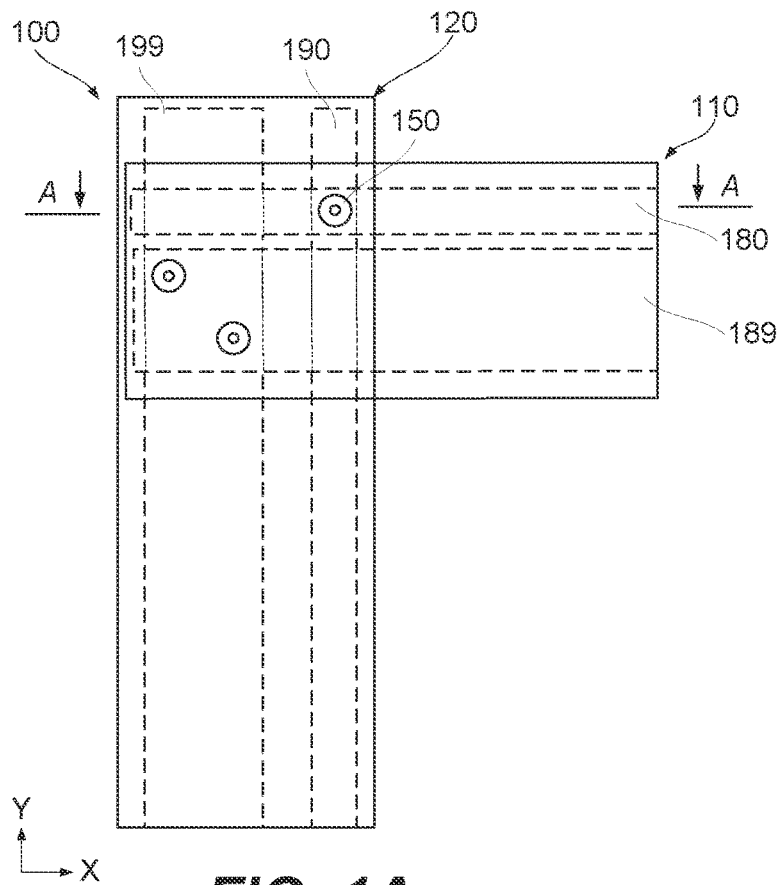
FIG. 1A is a schematic top view of a circuit assembly, comprising two flexible interconnect circuits with the circuit conductive elements connected by support structures, such as rivets, in accordance with some examples.

FIG. 1A illustrates one example of circuit assembly 100 comprising first flexible interconnect circuit 110 and second flexible interconnect circuit 120. In this example, first flexible interconnect circuit 110 comprises first conductive element 180 and first additional conductive element 189. First conductive element 180 and first additional conductive element 189 may be formed from the same metal sheet (e.g., by patterning the sheet) and, as such, may have the same thickness. In this example, first additional conductive element 189 is wider than first conductive element 180, e.g., allowing first additional conductive element 189 to carry larger currents (by having a larger cross-sectional area). However, other examples are within the scope. Similarly, second flexible interconnect circuit 120 comprises second conductive element 190 and second additional conductive element 199. Second flexible interconnect circuit 120 is fabricated separately from first flexible interconnect circuit 110 and then assembled into circuit assembly 100.

In some examples, conductive elements (e.g., first conductive element 180, first additional conductive element 189, second conductive element 190, and second additional conductive element 199) are formed from a metal sheet, such as a copper sheet, an aluminum sheet, and the like. For example, a rolled metal foil may be used. In contrast to the vertical grain structure associated with electrodeposited foil and/or plated metal, the horizontally-elongated grain structure of rolled metal foil may help to increase the resistance to the crack propagation in conductive elements, e.g., under cyclical loading conditions caused by bending (e.g., wire harnesses passing through movable parts). This may help to increase the fatigue life of the overall assembly.

In some examples, a conductive element comprises a base sublayer and a surface sublayer. The base sublayer may comprise aluminum, titanium, nickel, copper, steel, and various alloys and combinations of these metals. The base sublayer material may be selected to achieve desired electrical and thermal conductivities of the conductive element while maintaining minimal cost. The surface sublayer may comprise tin, lead, zinc, nickel, silver, palladium, platinum, gold, indium, tungsten, molybdenum, chrome, copper, alloys, and various combinations thereof, organic solderability preservative (OSP), or other electrically conductive materials. The surface sublayer material may be selected to protect the base sublayer from oxidation, improve the surface conductivity when forming electrical and/or thermal contact to the conductive element, improve adhesion to the conductive element, and/or other purposes. Furthermore, in some examples, an OSP coating is placed over the surface sublayer to minimize the surface sublayer oxidation. In these examples, the OSP coating may be referred to as a surface coating.

In some examples, a conductive element is solderable. For example, when a conductive element includes aluminum, the aluminum may be positioned as a base sublayer, while the surface sublayer may be made from a material having a melting temperature that is above the melting temperature of the solder. Otherwise, if the surface sublayer melts during circuit bonding, oxygen may penetrate through the surface sublayer and may oxidize the aluminum of the base sublayer. Hence, for many solders that are applied at temperatures ranging from 150° C.-300° C., the surface sublayer may be formed from zinc, silver, palladium, platinum, copper, nickel, chrome, tungsten, molybdenum, or gold. In some examples, e.g., in cases in which a high-frequency signal is to be transmitted down the signal line, the surface sublayer composition and thickness may be chosen to minimize resistance losses due to the skin effect.

Returning to FIG. 1A, during the fabrication of circuit assembly 100, first flexible interconnect circuit 110 and second flexible interconnect circuit 120 are individually formed, aligned (e.g., FIG. 1A showing two circuits at 90°) and interconnected (e.g., FIG. 1A illustrates first conductive element 180 is connected to second conductive element 190 and, separately, second flexible interconnect circuit 120 is connected to second additional conductive element 199.) One having ordinary skill in the art would understand that any orientations of flexible interconnect circuits and connection schemes of conductive elements are within the scope (e.g., any angles between interconnected circuits, any number of interconnected circuits). For example, FIG. 1A illustrates that first conductive element 180 extends over both second conductive element 190 and second additional conductive element 199 and can be connected to either one or both of these conductive elements. Similarly, first additional conductive element 189 extends over both second conductive element 190 and second additional conductive element 199 and can be connected to either one or both of these conductive elements. Furthermore, while FIG. 1A illustrates only two circuits (e.g., first flexible interconnect circuit 110 and second flexible interconnect circuit 120), circuit assembly 100 may include any number of circuits. Each connection area (e.g., circuit overlap) may include two or more circuits.

Returning to FIG. 1A, first conductive element 180 is connected to second conductive element 190 using support structure 150, such as a rivet. First additional conductive element 189 is connected to second additional conductive element 199 using multiple support structures 150, e.g., multiple rivets. The number of the support structures or, more specifically, the number of support structures in each connection may depend on the current ratings of this connection. One having ordinary skill in the art would understand that the current ratings depend on the support structure material and size, conductive element materials and size, and other parameters. Furthermore, it should be noted that support structures 150 may be used for mechanical support of first flexible interconnect circuit 110 and second flexible interconnect circuit 120 relative to each other. While the following description focuses on rivets, one having ordinary skill in the art would understand that other examples of support structures are also within the scope.

Figure 1B:
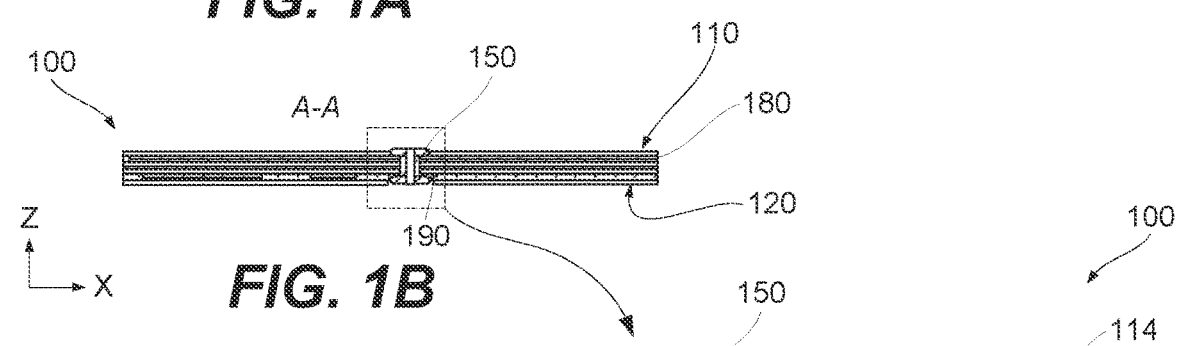
FIG. 1B is a schematic cross-sectional view of the circuit assembly in FIG. 1A, illustrating a support structure, such as a rivet, protruding through both flexible interconnect circuits.

FIG. 1B illustrates a cross-sectional view of circuit assembly 100 in FIG. 1A. The cross-section is along first conductive element 180. Specifically, FIG. 1B illustrates support structure 150 protruding through first flexible interconnect circuit 110 and second flexible interconnect circuit 120 while forming electrical connections between first conductive element 180 and second conductive element 190. In some examples, support structure 150 also provides mechanical support to first flexible interconnect circuit 110 and second flexible interconnect circuit 120.

Figure 1C:
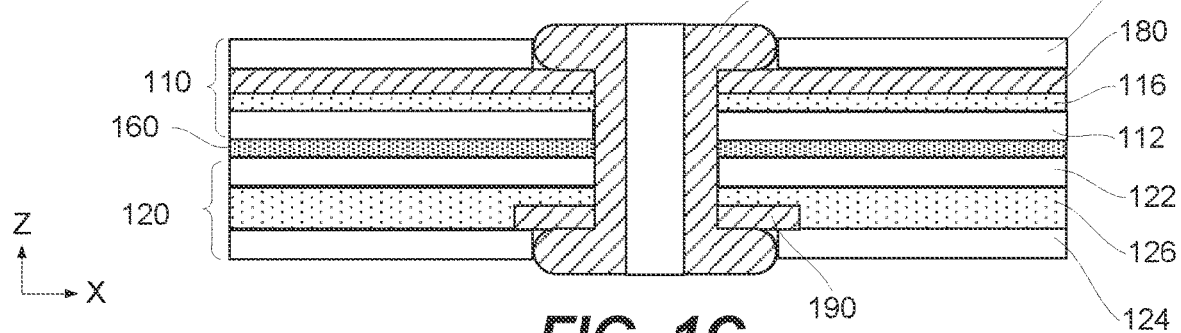
FIG. 1C is a schematic cross-sectional expanded view of the circuit assembly in FIG. 1B, showing the rivet and various other components of the circuit assembly, contacting and/or proximate the rivet.

FIG. 1C is an expanded view of the rivet connection in FIG. 1B. As shown, first flexible interconnect circuit 110 comprises first partially-outer dielectric 112 and first outer dielectric 114, enclosing various internal components of first flexible interconnect circuit 110, such as first conductive element 180 and first inner dielectric 116. First inner dielectric 116 can be used to support first partially-outer dielectric 112 and first outer dielectric 114 relative to each other and, at least partially, enclose first conductive element 180 (as well as any other conductive elements of first flexible interconnect circuit 110).

Similarly, second flexible interconnect circuit 120 comprises second partially-outer dielectric 122 and second outer dielectric 124, enclosing various internal components of second flexible interconnect circuit 120, such as second conductive element 190 and second inner dielectric 126. Second inner dielectric 126 can be used to support second partially-outer dielectric 122 and second outer dielectric 124 relative to each other and, at least partially, enclose second conductive element 190 (as well as any other conductive elements of second flexible interconnect circuit 120).

In some examples, first outer dielectric 114 and second outer dielectric 124 face away from each other or, in other words, form opposite sides of assembly 100 wherein the two circuits overlap. First partially-outer dielectric 112 and second partially-outer dielectric 122 face each other or, in other words, positioned within the assembly 100 wherein the two circuits overlap. In some examples, first partially-outer dielectric 112 and second partially-outer dielectric 122 contact each other. Alternatively, another component, e.g., assembly adhesive 160 is positioned between partially-outer dielectric 112 and second partially-outer dielectric 122.

In some examples, at least one of the outer or inner dielectrics comprises or consists essentially of crosslinked polyethylene (XLPE). For purposes of this disclosure, the term "consisting essentially" is defined as a composition of at least about 95% by weight or even 98% by weight. In some examples, the crosslinked XLPE is highly cross-linked XLPE, in which the degree of cross-linking is at least about 40%, at least about 70%, or even at least about 80%. Crosslinking prevents flowing/movement of dielectric material, e.g., first inner dielectric 116 and second inner dielectric 126, within the operating temperature range of flexible interconnect circuits, which may be between about −40° C. (−40° F.) to +105° C. (+220° F.). This lack of flow prevents shorts between conductive elements of the circuit. Furthermore, the crosslinking prevents the oozing of inner dielectrics from the edges and openings of flexible interconnect circuits.

In some examples, the materials used for outer and inner dielectrics are specifically selected to enhance the flexibility of interconnect circuits. Some suitable examples are polyolefins, which are predominantly linear polymers (as compared to polyesters, which contain an aromatic ring and therefore are less flexible). In particular, silane-modified polyolefins may be used for one or both inner or outer dielectrics. Some specific combinations include a modified polypropylene for one or both outer dielectric layers and a modified linear low-density polyethylene (LLDPE). In another example, a modified polypropylene may be used for all inner and outer dielectrics. In yet another example, a co-extruded material comprising a modified LLDPE and a modified polypropylene may be used for at least one of the inner and outer dielectrics. In general, a coextruded film comprising a combination of a high-melt polymer and a low-melt polymer may be used for a flexible interconnect circuit. The high-melt polymer may function as an outer dielectric, while the low-melt polymer may function as an inner dielectric and is used for gap fill between conductive leads. In some examples, a thermoplastic polyurethane (TPU) or, more specifically, a polyurethane ether may be used as one or both of outer dielectrics. The flexibility of polyurethanes can be tuned by using appropriate chemistry. In some examples, outer and/or inner dielectrics comprise one or more transparent materials, e.g., one or more elastomeric polymers, such as ethylene-butylene copolymers, plasticizer-compounded polyolefins, and the like.

In some examples, at least one of the dielectrics comprises a flame retardant, e.g., phosphorus, organophosphorus, and the like. The flame retardant may be added, e.g., as particles, into a polymer matrix, various examples of which are listed above. Alternatively, a flame retardant may be in the form of a standalone structure, e.g., a flame retardant paper or a flame barrier. More specifically, one outer dielectric may comprise polyethylene naphthalate (PEN), while the other one comprises a flame retardant paper. It should be noted that conventional circuits (formed by etching and other like processes) are not able to use flame barriers for their dielectric layers. In some examples, polyimide (PI) may be used for one or more dielectric layers, in addition, or instead of flame retardants because of its inherent combustion-resistant properties.

In some examples, one or more dielectrics comprises a coefficient of thermal expansion (CTE)-matching additive. The composition and concentration of the CTE-matching additive in these dielectric layers are specifically selected to match that of conductive elements or, more specifically, a combination of the conductive elements and/or more inner dielectrics. It should be noted that a flexible interconnect circuit may be subjected to temperature fluctuations during its manufacturing (e.g., one or more lamination operations described below) and/or operation (e.g., operating in an engine bay of a vehicle). For example, one or both of outer dielectric comprises a polymer matrix, comprising polyethylene terephthalate (PET) and/or polyethylene naphthalate (PEN), and a CTE-matching additive, distributed within this matrix and comprising inorganic fillers, such as glass fibers, and mica/silica. The CTE-matching additive may be in the form of particles having a low aspect ratio (e.g., less than 0.5) or having a high aspect ratio (e.g., greater than 1). The concentration of the CTE-matching additive in the outer dielectric may be between 10% by weight and 50% by weight. While high concentrations of the CTE-matching additive may help to reduce the CTE mismatch, the flexibility of these dielectrics may suffer from excessive amounts of the CTE-matching additive.

First flexible interconnect circuit 110 and second flexible interconnect circuit 120 are stacked together along the Z-axis. In some examples, circuit assembly 100 also comprises assembly adhesive 160, positioned between first flexible interconnect circuit 110 and second flexible interconnect circuit 120. For example, FIG. 1C illustrates assembly adhesive 160 positioned between and directly interfacing first partially-outer dielectric 112 and second partially-outer dielectric 122. Assembly adhesive 160 is used to support first flexible interconnect circuit 110 and second flexible interconnect circuit 120 relative to each other.

FIG. 1C illustrates support structure 150 protruding through first conductive element 180 and second conductive element 190 and any components positioned between first conductive element 180 and second conductive element 190, such as first partially-outer dielectric 112, assembly adhesive 160, and second partially-outer dielectric 122. It should be noted that no components are needed between first conductive element 180 and second conductive element 190 in this connection area. In some examples, first conductive element 180 and second conductive element 190 directly interface with each other, e.g., by forming large openings in first partially-outer dielectric 112 and second partially-outer dielectric 122 (and in assembly adhesive 160, if one is present) and out-of-the-plane deflection of first conductive element 180 and second conductive element 190. This direct contact enhances the electrical connection between first conductive element 180 and second conductive element 190, e.g., in addition to the electrical connection provided by support structure 150.

Figure 1D:
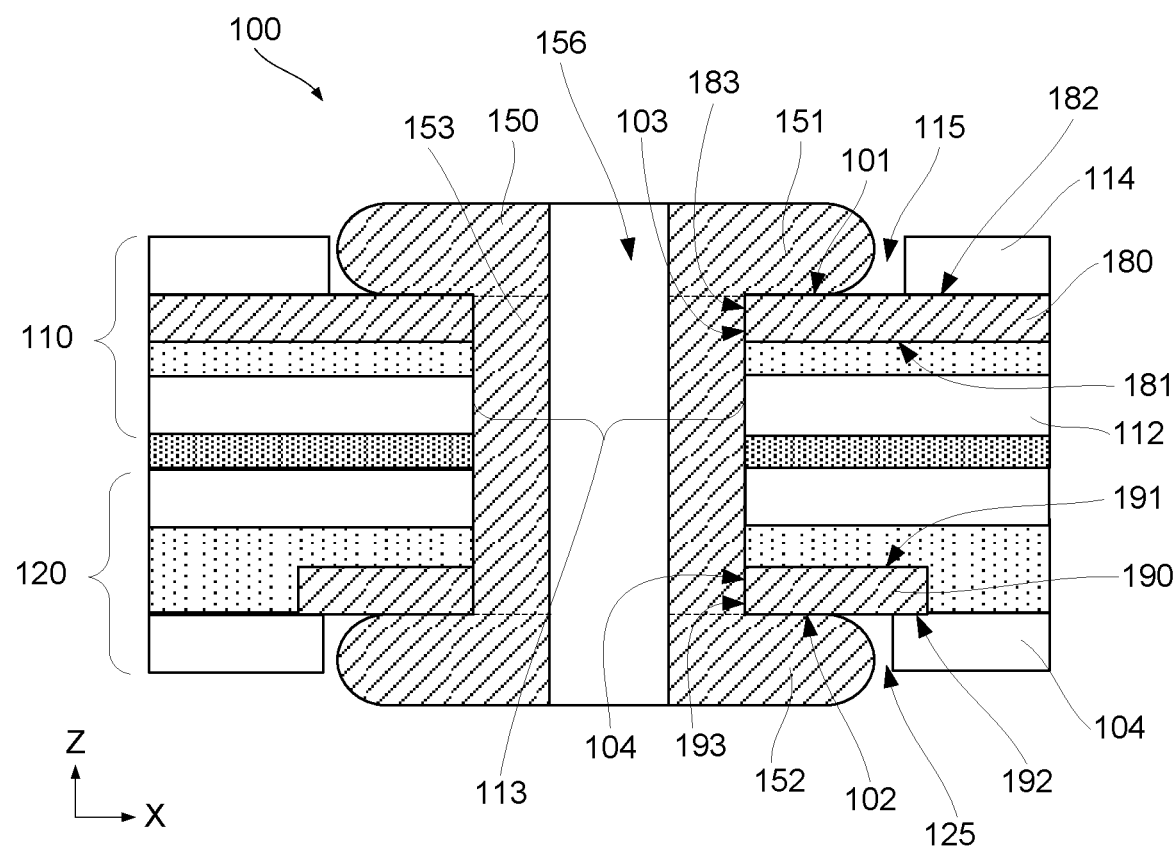
FIG. 1D is another schematic cross-sectional expanded view of the circuit assembly in FIG. 1B, identifying various contact interfaces formed by the rivet and the conductive elements of the two flexible interconnect circuits.

Referring to FIG. 1C, support structure 150 various components of circuit assembly 100, such as first conductive element 180 and second conductive element 190 as well as any components positioned between first conductive element 180 and second conductive element 190. The electrical connections between support structure 150 and each of first conductive element 180 and second conductive element 190 are provided by various interfaces. Specifically, FIG. 1D illustrates support structure 150 comprising first head 151, second head 152, and stem 153 extending between first head 151 and second head 152. Each of first head 151 and stem 153 directly contacts first conductive element 180. Furthermore, each of second head 152 and stem 153 directly contacts second conductive element 190. Furthermore, first head 151 forces first conductive element 180 toward second conductive element 190, while second head 152 forces second conductive element 190 toward first conductive element 180. The components positioned between first conductive element 180 and second conductive element 190 resist these forces (e.g., by being partially compressed and pushing back) thereby maintaining the contact between first head 151 and first conductive element 180 as well as the contact between second head 152 and second conductive element 190.

Referring to FIG. 1D, first conductive element 180 comprises first inner-facing side 181, first outer-facing side 182, and first edge 183. First outer-facing side 182 is opposite to first inner-facing side 181. First edge 183 extends between first inner-facing side 181 and first outer-facing side 182. Similarly, second conductive element 190 comprises second inner-facing side 191, second outer-facing side 192, and second edge 193. Second outer-facing side 192 is opposite to second inner-facing side 191. Second edge 193 extends between second inner-facing side 191 and second outer-facing side 192. First outer-facing side 182 and second outer-facing side 192 face away from each other. At the same time, first inner-facing side 181 and second inner-facing side 191 face each other. In some examples (e.g., with rivet stem 153 having a constant diameter), first edge 183 is coplanar to second edge 193.

In some examples, first outer-facing side 182 directly contacts first head 151 of support structure 150 and forms first contact interface 101 with first head 151. Similarly, second outer-facing side 192 directly contacts second head 152 of support structure 150 and forms second contact interface 102 with second head 152. In some examples, first edge 183 directly contacts rivet stem 153 and forms first additional contact interface 103. Second edge 193 also directly contacts rivet stem 153 and forms second additional contact interface 104. In more specific examples, the area of first additional contact interface 103 is less than the area of first contact interface 101. Similarly, the area of second additional contact interface 104 is less than the area of second contact interface 102. As such, in some examples, first contact interface 101 and second contact interface 102 are primarily responsible for the electrical conductivity between support structure 150 and each of first conductive element 180 and second conductive element 190.

As noted above, in some examples, first flexible interconnect circuit 110 comprises first outer dielectric 114 such that first conductive element 180 is disposed between first partially-outer dielectric 112 and first outer dielectric 114. As shown in FIG. 1D, first outer dielectric 114 comprises first-outer-dielectric opening 115. At least a portion of first head 151 of support structure 150 protrudes through first-outer-dielectric opening 115, directly contacting and forming first contact interface 101 with first outer-facing side 182 of first conductive element 180. In other words, before installing support structure 150, first-outer-dielectric opening 115 exposes a portion of first outer-facing side 182 of first conductive element 180. When support structure 150 is installed, this portion is used to form first contact interface 101.

Similarly, in some examples, second flexible interconnect circuit 120 comprises second outer dielectric 124 such that second conductive element 190 is disposed between second outer dielectric 124 and first partially-outer dielectric 112. As shown in FIG. 1D, second outer dielectric 124 comprises second-outer-dielectric opening 125, at least a portion of second head 152 of support structure 150 protrudes through second-outer-dielectric opening 125, directly contacting and forming second contact interface 102 with second outer-facing side 192 of second conductive element 190.

In some examples, to form contacts with rivet stem 153, the openings in first conductive element 180 and second conductive element 190 have the same diameter as rivet stem 153 or even smaller than rivet stem 153, e.g., to ensure press fit of rivet stem 153 and the direct contact. The openings in other components, positioned between first conductive element 180 and second conductive element 190, may have the same diameter as rivet stem 153 or larger (e.g., at least within 10% to ensure mechanical support to rivet stem 153).

Figure 1E:
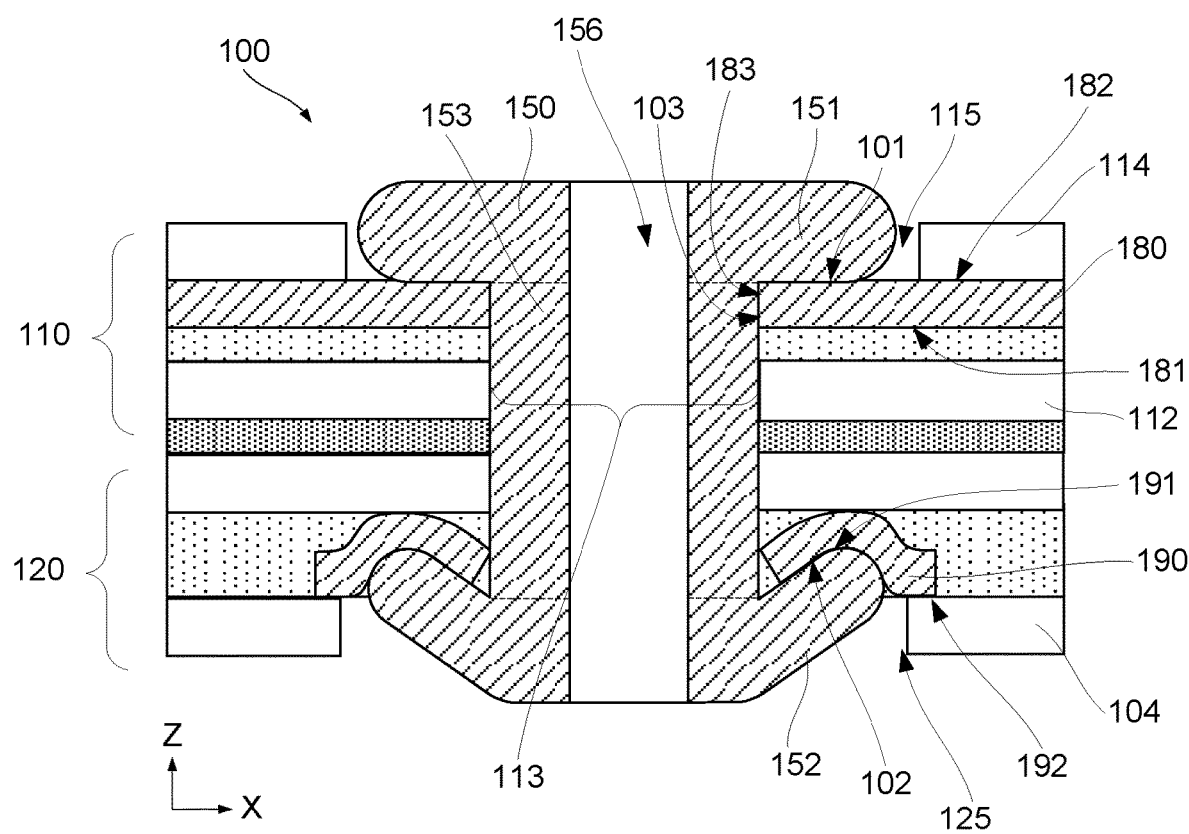
FIG. 1E is a schematic cross-sectional view of another example of the circuit assembly showing a different shape of the rivet head.

Referring to FIG. 1E, in some examples, second contact interface 102 is not parallel to first contact interface 101. For example, second head 152 may be bent toward rivet stem 153, thereby forming a cavity between second head 152 and rivet stem 153. A portion of second conductive element 190 protrudes into this cavity thereby securing second conductive element 190 relative to support structure 150. In some examples, the angle between second contact interface 102 and stem 153 of support structure 150 is less than 90° or, more specifically, less than 80° or even less than 70°. In some examples (not shown), first head 151 is also shaped like second head 152 in FIG. 1E.

Figure 1F:
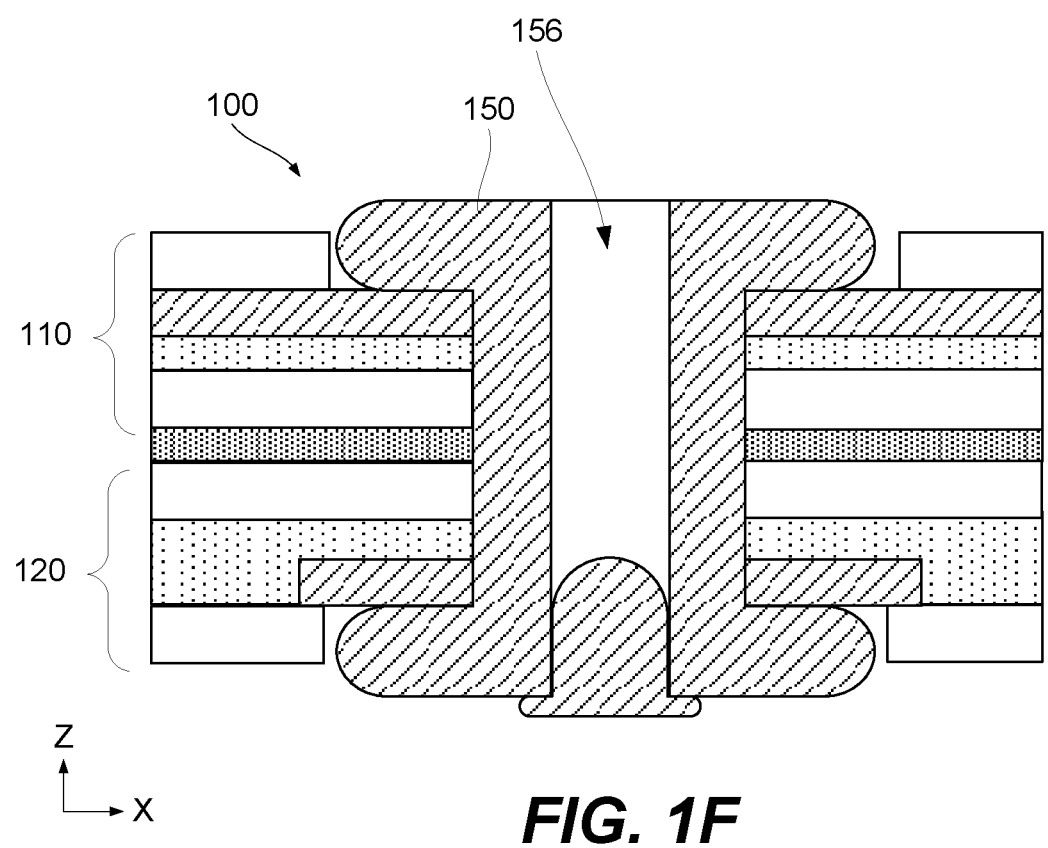
FIG. 1F is a schematic cross-sectional view of yet another example of the circuit assembly showing a blind hole through the rivet.

In some examples, support structure 150 comprises opening 156 extending through first head 151 and at least a portion of stem 153. More specifically, opening 156 of support structure 150 can be a through opening further extending through second head 152 as, e.g., is shown in FIGS. 1D and 1E. A through opening allows forming various connections, using this opening, from either side of circuit assembly 100 or even from both sides at the same time. Various examples of these connections are described below with reference to FIGS. 2A and 2B. Alternatively, opening 156 of support structure 150 is a blind opening as, e.g., is shown in FIG. 1F. For example, a mandrel head may be left in opening 156, blocking a part of this opening.

Figure 2A:
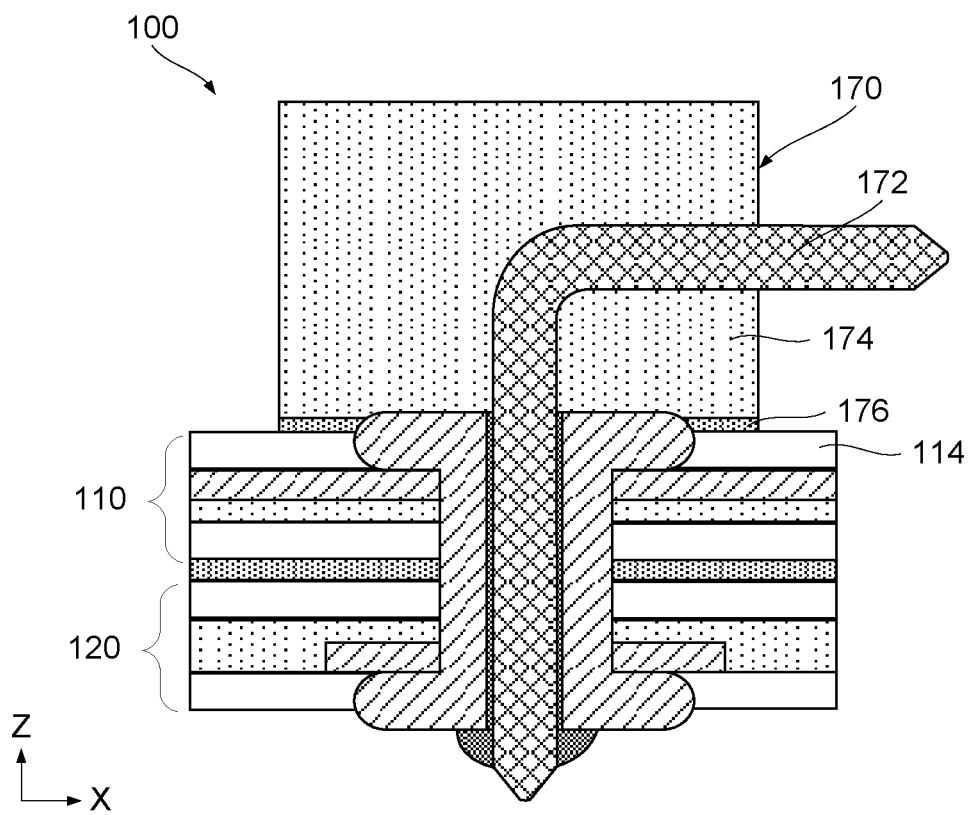
FIGS. 2A and 2B are schematic cross-sectional views of circuit assemblies with external connectors, mechanically and electrically coupled to the corresponding rivets of the assemblies.
Figure 2B:
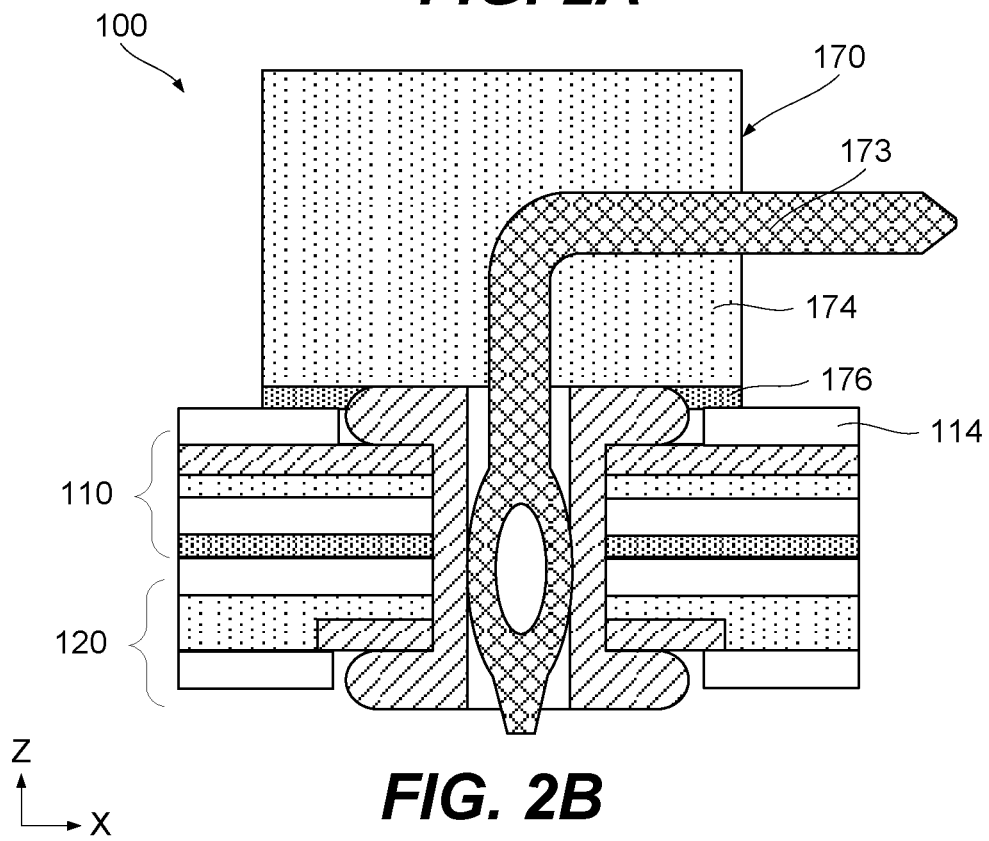

Referring to FIGS. 2A and 2B, in some examples, circuit assembly 100 comprises external connector 170, connected to support structure 150 and electrically coupled by support structure 150 to each of first conductive element 180 and second conductive element 190. In other words, support structure 150 not only interconnects first conductive element 180 and second conductive element 190 but also couples these conductive elements to external connector 170. For example, a portion of external connector 170, e.g., pin 172, extends into opening 156 of support structure 150. In some examples, external connector 170 is soldered in opening 156 of support structure 150 as, e.g., is shown in FIG. 2A. In other examples, external connector 170 comprises press-fit pin 173, inserted into opening 156 of support structure 150. In some examples, external connector 170 comprises housing 174, which may be attached to first flexible interconnect circuit 110 or, more specifically, to first outer dielectric 114. For example, connector adhesive 176 may be disposed between first outer dielectric 114 and housing 174 as, e.g., is schematically shown in FIGS. 2A and 2B.

Figure 3:
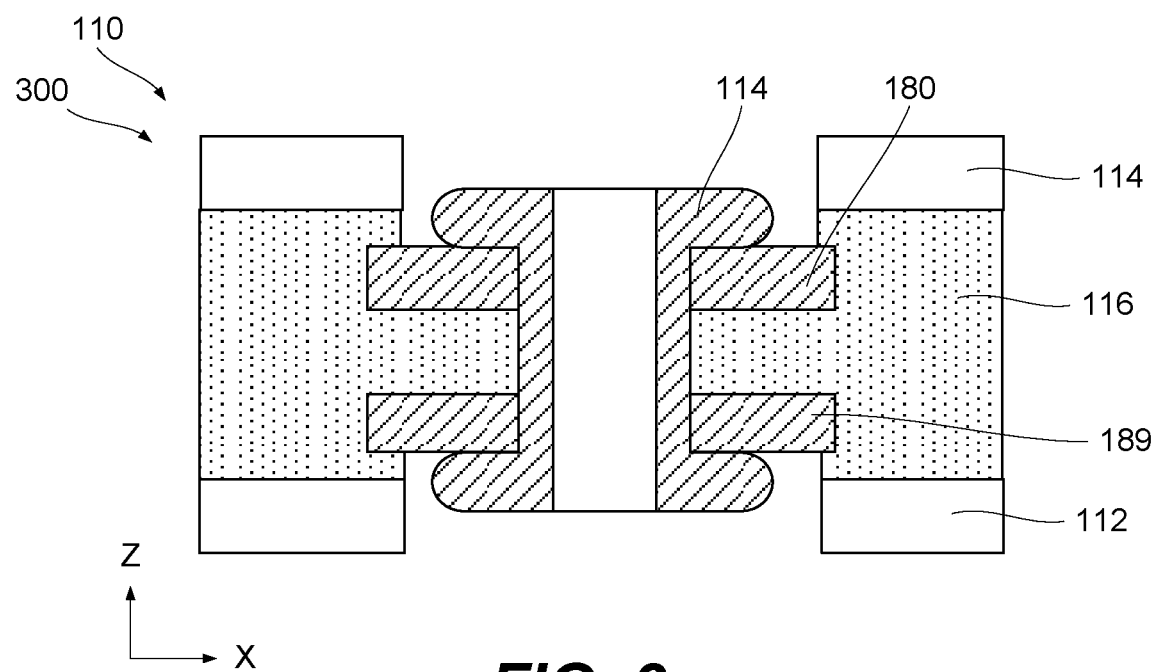
FIG. 3 is a schematic cross-sectional view of a flexible multilayered interconnect circuit, illustrating a rivet interconnecting different conductive elements of the interconnect circuit.

In some examples, support structure 150 is used to interconnect conductive elements within the same flexible interconnect circuit. FIG. 3 illustrates first flexible interconnect circuit 110 comprising first conductive element 180 and first additional conductive element 189. This type of flexible interconnect circuit 110 can be referred to as a flexible multilayered interconnect circuit. First conductive element 180 and first additional conductive element 189 are stacked along the Z-axis between first partially-outer dielectric 112 and first outer dielectric 114 (and an example of first flexible interconnect circuit 110 shown in FIG. 1A, where first conductive element 180 and first additional conductive element 189 are positioned next to each other within the X-Y plane). In this example, support structure 150 protrudes through both first conductive element 180 and first additional conductive element 189. Support structure 150 also interconnects these elements. Similar to other examples described above, support structure 150 allows forming of external electrical connections to first conductive element 180 and first additional conductive element 189.

Figure 4:
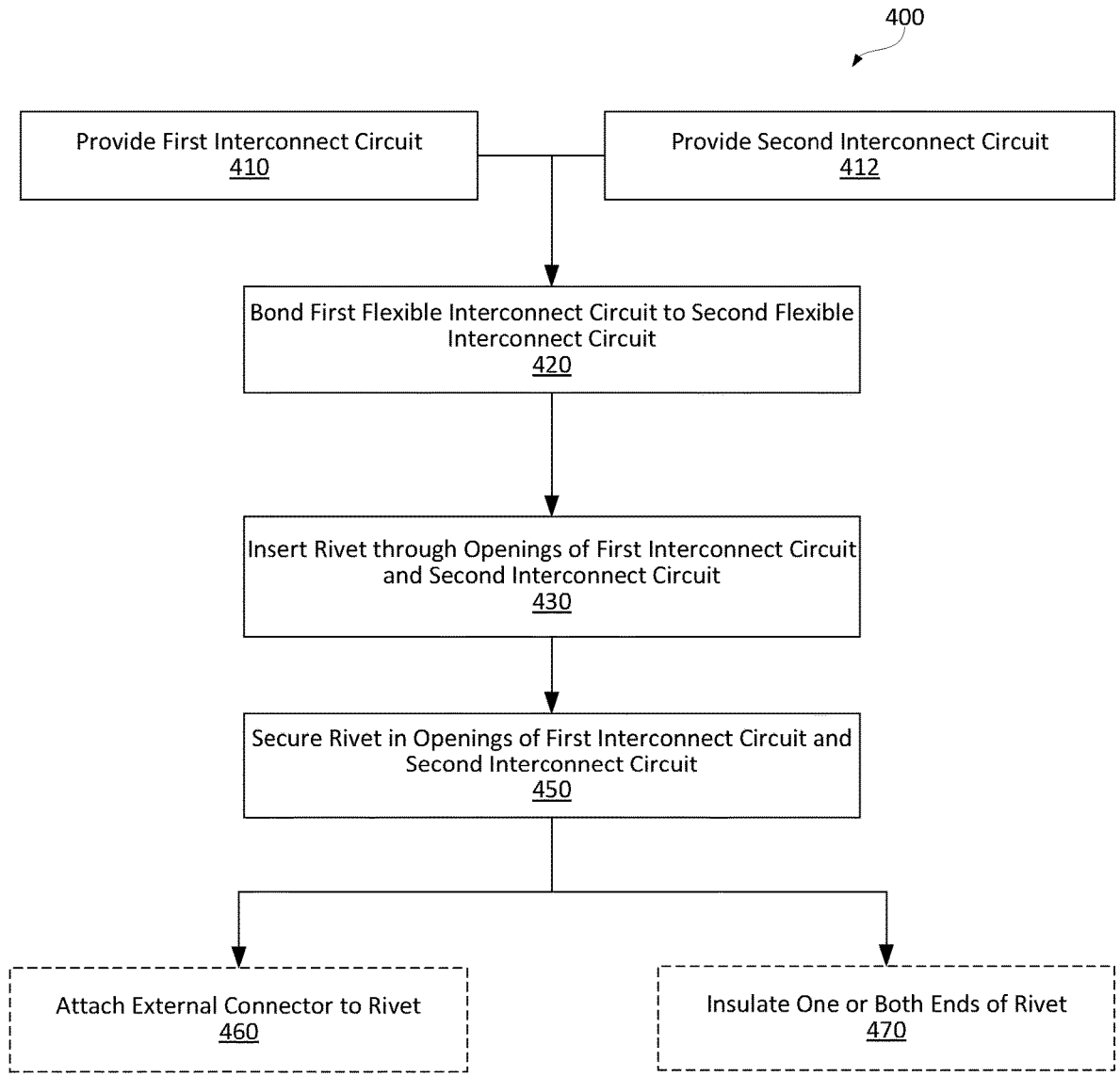
FIG. 4 is a process flowchart corresponding to a method of forming a circuit assembly, comprising two flexible interconnect circuits with conductive elements of different interconnect circuits connected by rivets, in accordance with some examples.
Figure 5A:
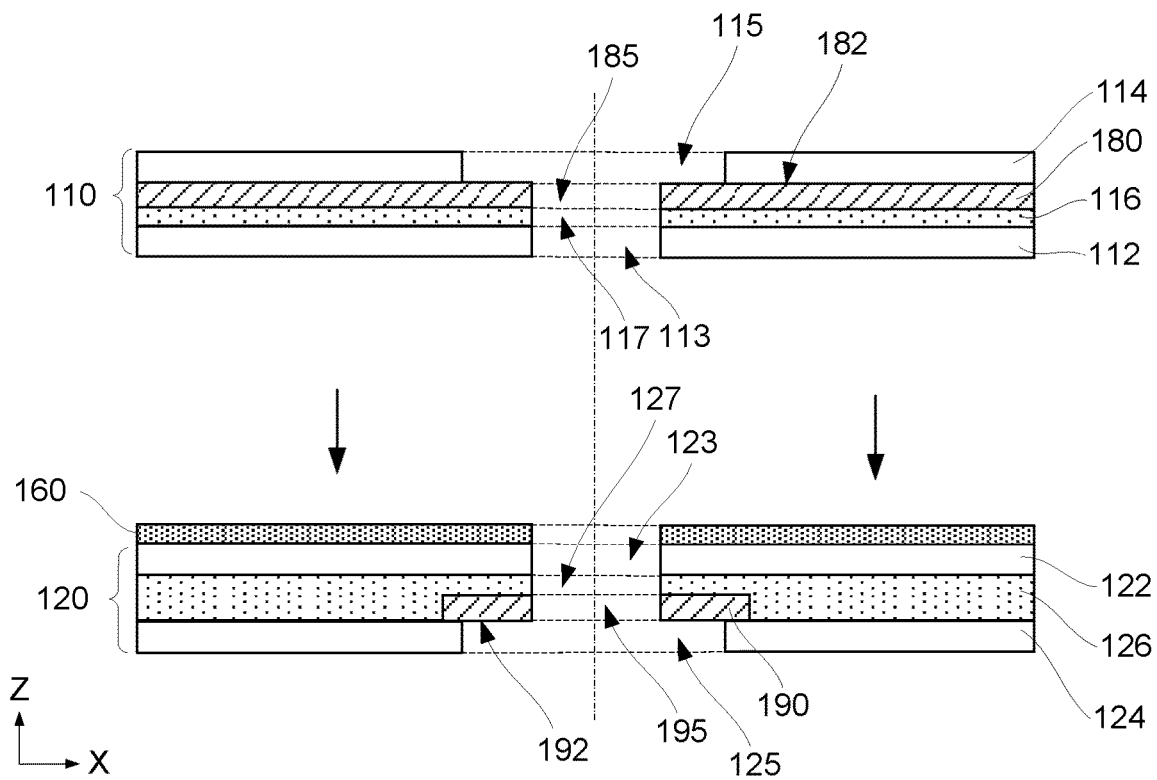
FIGS. 5A, 5B, 5C, 5D, 5E, and 5F illustrate different stages and examples while forming the circuit assembly in accordance with the method of FIG. 4.

FIG. 4 is a process flowchart corresponding to method 400 of forming circuit assembly 100, in accordance with some examples. Method 400 comprises providing (block 410) first flexible interconnect circuit 110. Various examples of first flexible interconnect circuit 110 are described above. As shown in FIG. 5A, in some examples, first flexible interconnect circuit 110 comprises first partially-outer dielectric 112 and first conductive element 180. First partially-outer dielectric 112 comprises first-partially-outer-dielectric opening 113. First conductive element 180 comprises first-conductive-element opening 185. First-conductive-element opening 185 is concentric to first-partially-outer-dielectric opening 113. Furthermore, in more specific examples, first-conductive-element opening 185 and first-partially-outer-dielectric opening 113 have the same diameters. In some examples, first flexible interconnect circuit 110 comprises other components, such as first outer dielectric 114 and/or first inner dielectric 116. In these examples, first outer dielectric 114 comprises first-outer-dielectric opening 115, while first inner dielectric 116 comprises first-inner-dielectric opening 117. First-outer-dielectric opening 115 and first-inner-dielectric opening 117 may be concentric to each other and to each of first-conductive-element opening 185 and first-partially-outer-dielectric opening 113. The diameter of first-outer-dielectric opening 115 may be greater than that of first-conductive-element opening 185 as, e.g., is shown in FIG. 5A. This diameter difference allows keeping a portion of first outer-facing side 182 of first conductive element 180 exposed through first-outer-dielectric opening 115.

Method 400 comprises providing (block 412) second flexible interconnect circuit 120. Various examples of second flexible interconnect circuit 120 are described above. As shown in FIG. 5A, in some examples, second flexible interconnect circuit 120 comprises second conductive element 190. Second conductive element 190 comprises second-conductive-element opening 195. Second-conductive-element opening 195 is used for receiving support structure 150 during later operations. In some examples, the diameter of second-conductive-element opening 195 is the same or slightly less than the diameter of support structure 150 (e.g., to ensure a tight fit). In some examples, second flexible interconnect circuit 120 also comprises In some examples, second flexible interconnect circuit 120 comprises other components, such as second partially-outer dielectric 122, second outer dielectric 124, and/or second inner dielectric 126. In these examples, second partially-outer dielectric 122 comprises second-partially-outer-dielectric opening 123, second outer dielectric 124 comprises second-outer-dielectric opening 125, while second inner dielectric 126 comprises second-inner-dielectric opening 127. Second-partially-outer-dielectric opening 123, second-outer-dielectric opening 125, and second-inner-dielectric opening 127 may be concentric to each other and to second-conductive-element opening 195. The diameter of second-outer-dielectric opening 125 may be greater than that of second-conductive-element opening 195 as, e.g., is shown in FIG. 5A. This diameter difference allows keeping a portion of second outer-facing side 192 of second conductive element 190 exposed through second-outer-dielectric opening 125.

In some examples, first flexible interconnect circuit 110 or second flexible interconnect circuit 120 has assembly adhesive 160 located on a partially-outer dielectric. For example, FIG. 5A illustrates assembly adhesive 160 positioned over second partially-outer dielectric 122 of second flexible interconnect circuit 120. Assembly adhesive 160 is used to provide mechanical support to first flexible interconnect circuit 110 and second flexible interconnect circuit 120 relative to each other.

Figure 5B:
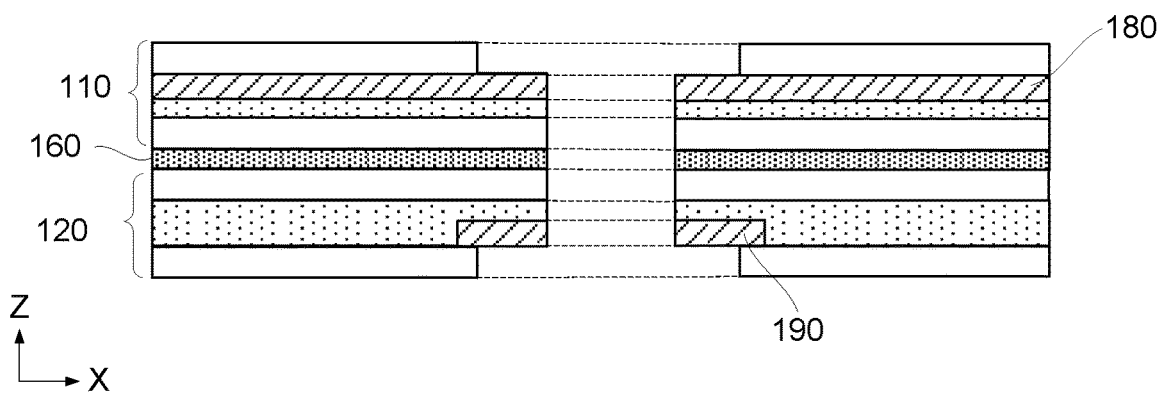

In some examples, method 400 proceeds with bonding (block 420) first flexible interconnect circuit 110 to second flexible interconnect circuit 120. This operation is performed while maintaining first-conductive-element opening 185 concentric with second-conductive-element opening 195, e.g., as shown in FIG. 5B. After this operation, first partially-outer dielectric 112 is disposed between first conductive element 180 and second conductive element 190. In some examples, other components are positioned between adhering first flexible interconnect circuit 110 to second flexible interconnect circuit 120, such as second partially-outer dielectric 122 and portions of first inner dielectric 116 and second inner dielectric 126. When other components are present in the stack, their respective openings are kept concentric. It should be noted that not all openings have the same diameters. In some examples, the smallest openings in each of first flexible interconnect circuit 110 to second flexible interconnect circuit 120 are used for alignment of first flexible interconnect circuit 110 and second flexible interconnect circuit 120, e.g., to ensure that all openings are concentric.

In some examples, assembly adhesive 160 is used for this bonding operation. For example, assembly adhesive 160 is used for this bonding operation. For example, first flexible interconnect circuit 110 and second flexible interconnect circuit 120 may be laminated with assembly adhesive 160 positioned in between. After this bonding operation, the orientation of first flexible interconnect circuit 110 and second flexible interconnect circuit 120 is secured.

Figure 5C:
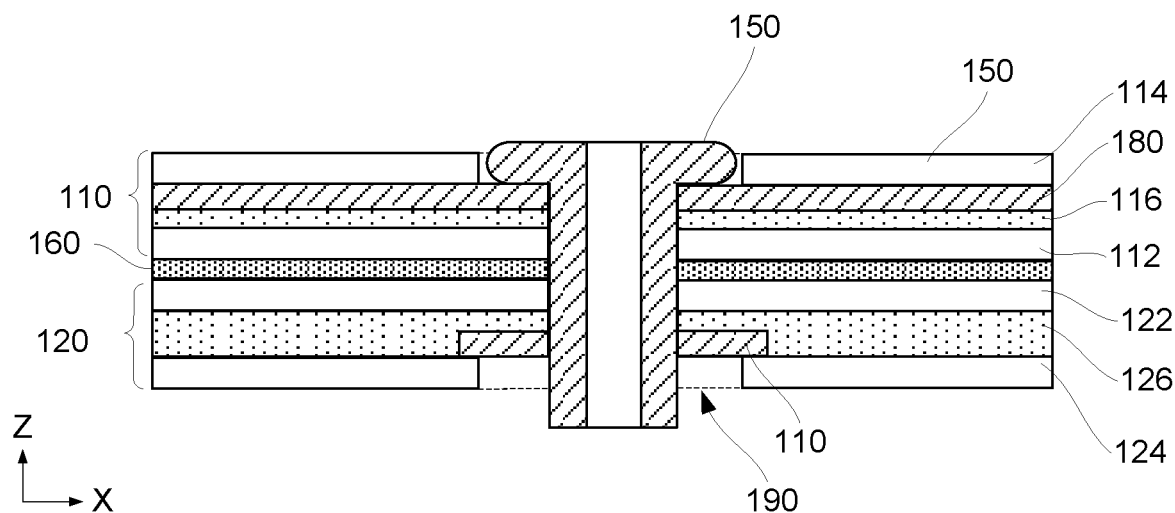

Method 400 continues with inserting (block 430) support structure 150 through first-conductive-element opening 185, first-partially-outer-dielectric opening 113, and second-conductive-element opening 195, e.g., as schematically shown in FIG. 5C. In some examples, support structure 150 is inserted after first flexible interconnect circuit 110 and second flexible interconnect circuit 120 are bonded together. Alternatively, support structure 150 is inserted before bonding first flexible interconnect circuit 110 and second flexible interconnect circuit 120. For example, support structure 150 may be used for establishing and maintaining the relative orientation of first flexible interconnect circuit 110 and second flexible interconnect circuit 120 or, more specifically, for maintaining first-conductive-element opening 185, first-partially-outer-dielectric opening 113, and second-conductive-element opening 195 concentric while first flexible interconnect circuit 110 and second flexible interconnect circuit 120 is bonded. Support structure 150 may be already secured or not during this bonding operation.

Figure 5D:
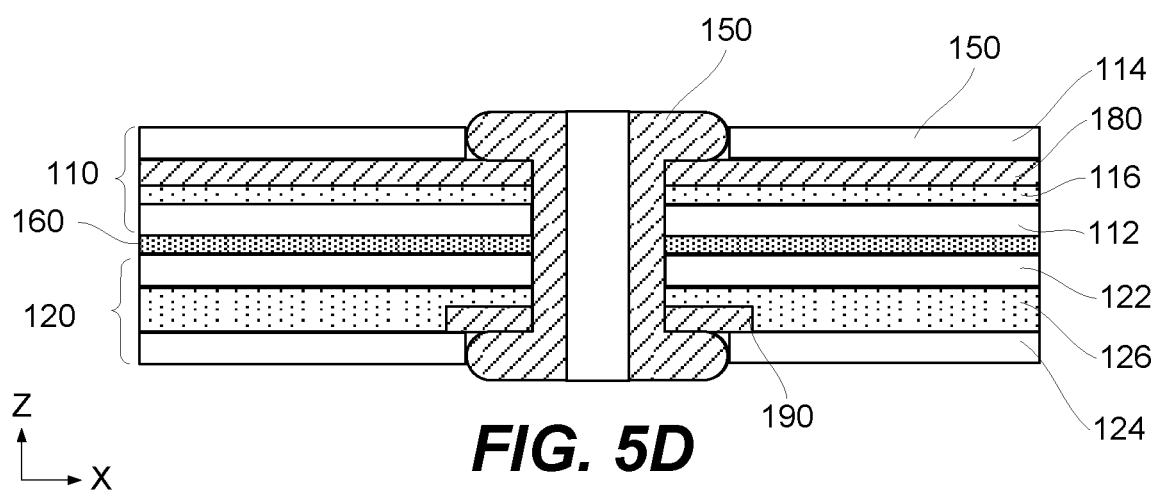

Method 400 proceeds with securing (block 450) support structure 150 in first-conductive-element opening 185, first-partially-outer-dielectric opening 113, and second-conductive-element opening 195. For example, before this securing operation, support structure 150 comprises first head 151 and stem 153 as, e.g., is shown in FIG. 5C. The securing operation forms second head 152 as, e.g., is shown in FIG. 5D. After this securing operation, support structure 150 electrically interconnects first conductive element 180 and second conductive element 190. For example, support structure 150 directly contacts first conductive element 180 and second conductive element 190. In some examples, support structure 150 compresses first conductive element 180 and second conductive element 190 toward each other.

Figure 5E:
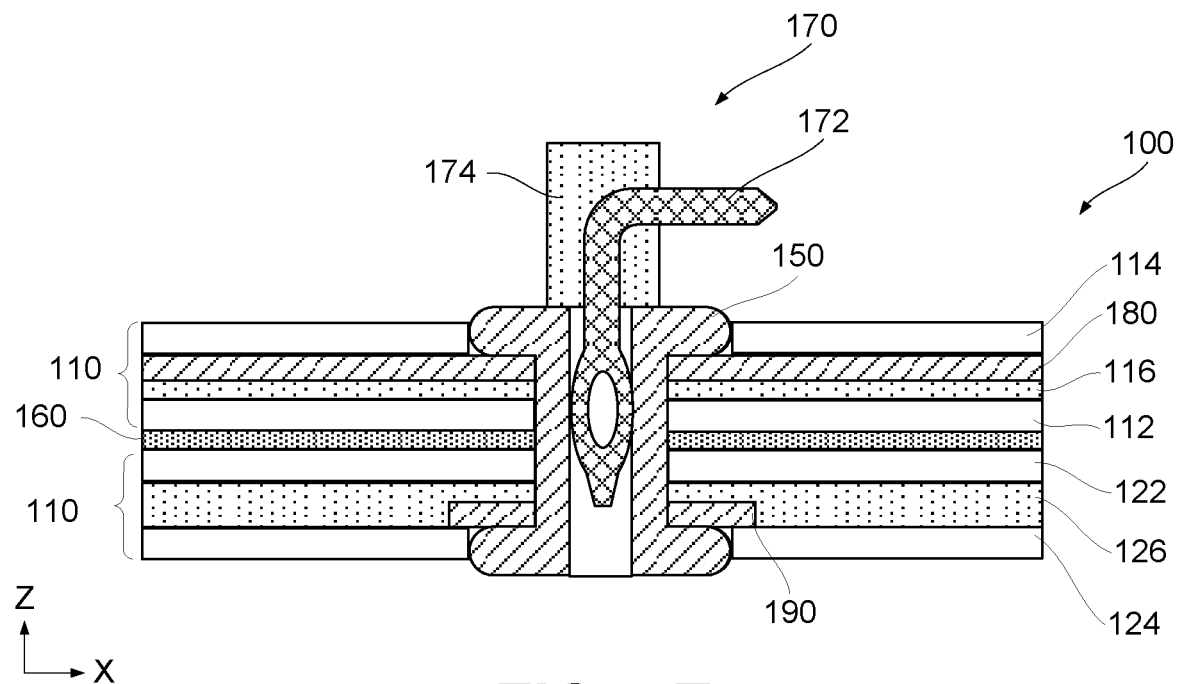

In some examples, method 400 proceeds with attaching (block 460) external connector 170 to support structure 150 as, e.g., is schematically shown in FIG. 5E. For example, pin 172 of external connector 170 is inserted into opening 156 and either soldered to support structure 150 or otherwise secured within opening 156. In more specific examples, pin 172 of external connector 170 is soldered within opening 156. Alternatively, pin 172 is press-fit pin 173 and is secured within opening 156 by expansion forces operable by press-fit pin 173 onto opening 156.

Figure 5F:
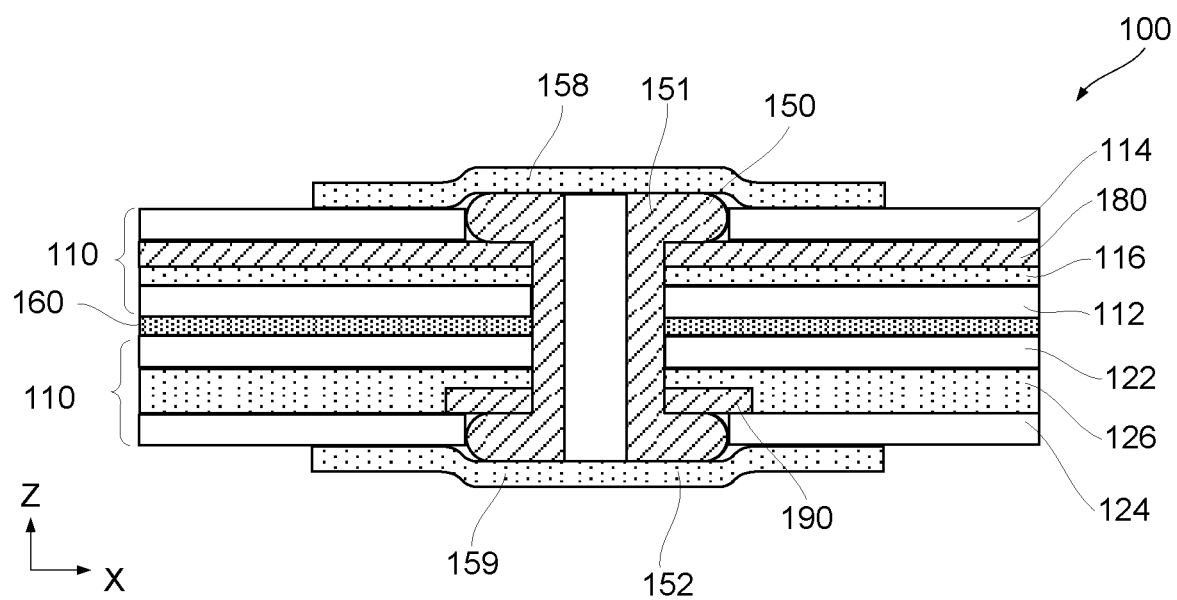

In some examples, method 400 proceeds with electrically insulating (block 470) one or both ends of 150 as, e.g., is schematically shown in FIG. 5F. For example, first insulator patch 158 may be positioned over first head 151 of support structure 150 and partially extends over first outer dielectric 114. Similarly, second insulator patch 159 may be positioned over second head 152 of support structure 150 and partially extends over second outer dielectric 124.

Figure 7A:
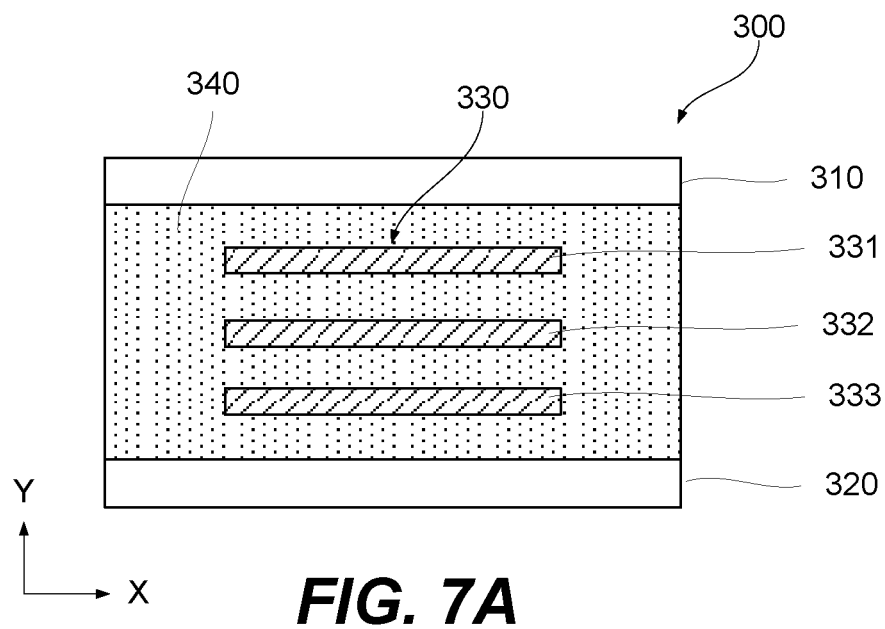
FIGS. 7A, 7B, 7C, 7D, 7E, and 7F illustrate cross-sectional views of various flexible multilayered interconnect circuits, in accordance with one or more embodiments.

Examples of Interconnecting Different Layers in Flexible Multilayered Interconnect Circuit In some examples, a flexible interconnect circuit has a stacked arrangement of conductive elements as, e.g., is shown in FIG. 3 and described above with reference to this figure. This type of circuit can be referred to as a flexible multilayered interconnect circuit. Another example of flexible multilayered interconnect circuit 300 is presented in FIG. 7A. In this example, flexible multilayered interconnect circuit 300 comprises first outer dielectric 310 and second outer dielectric 320. These outer dielectrics collectively seal various internal components of flexible multilayered interconnect circuit 300. Multilayered interconnect circuit 300 comprising conductors 330, stacked between first outer dielectric 310 and second outer dielectric 320 along the thickness of flexible multilayered interconnect circuit 300 (the Y direction). While FIG. 7A illustrates a 3-layered stack of conductive elements, one having ordinary skill in the art would understand that a stack may be formed by any number of conductive elements (e.g., two as in FIG. 3, three, four, or more). It should also be understood by one having ordinary skill in the art that the systems and methods described herein may also be implemented with a stack comprising only one conductive layer. With multiple conductors 330, these conductors 330 are supported relative to each other by inner dielectric 340.

In some examples, conductors 330 are grouped within circuit 300, forming different portions of circuit 300, such as signal transmission portions and power transmission portions. Each portion comprises one or more conductors 330. Conductors 330 in each portion are specifically configured and arranged to provide various functions, such as transmitting high-frequency signals while shielding one or signal lines, transmitting power, and the like. In some examples, flexible hybrid interconnect circuit 100 is attached to a panel (or any other supporting structure or a heat sink) using an adhesive layer or, more specifically, a thermally conductive adhesive layer.

Figure 6:
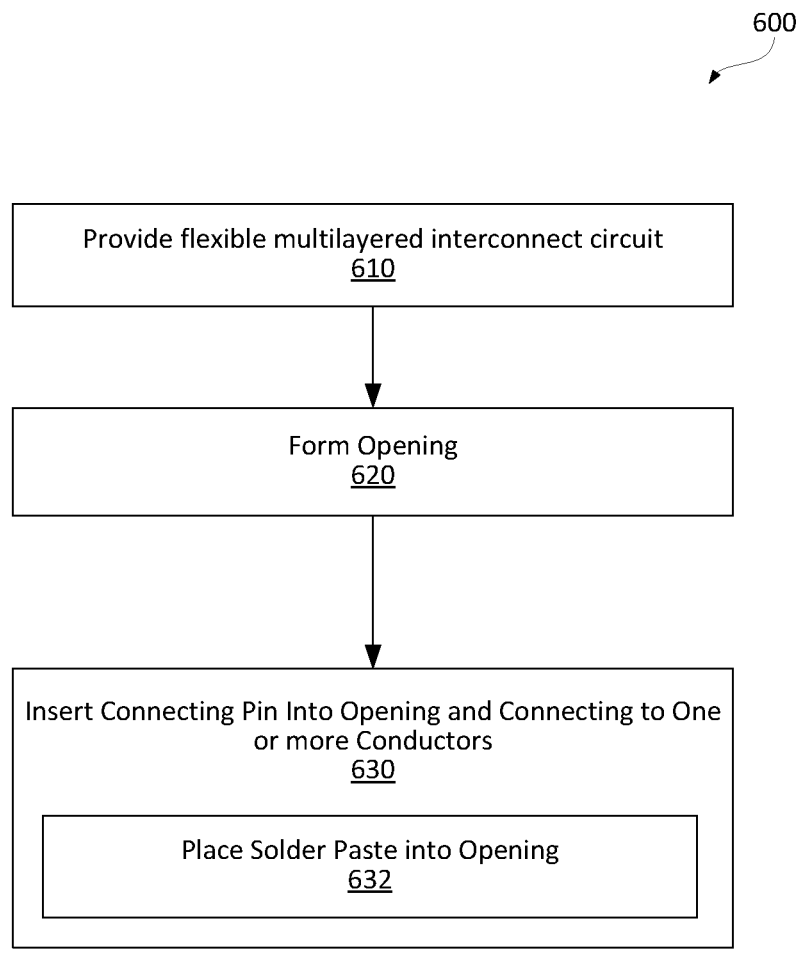
FIG. 6 is a process flowchart corresponding to a method for forming electrical connections to a connector, in accordance with one or more embodiments.

In some examples, different conductors 330 of flexible multilayered interconnect circuit 300 need to be interconnected and/or connected to an external structure, such as a connecting pin. This pin can be a portion of an external connector, printed circuit board, or the like. FIG. 6 is a process flowchart corresponding to method 600 of forming electrical connections between a connecting pin and one or more conductors 330 of flexible multilayered interconnect circuit 300, in accordance with some examples. A connecting pin is one example of connecting structures, which also include rivets and the like, all of which are within the scope.

Method 600 commences with (block 610) providing flexible multilayered interconnect circuit 300. One example of circuit 300 is shown in FIG. 7A. In this example, flexible multilayered interconnect circuit 300 comprises three conductors 330 (e.g., first conductor 331, second conductor 332, and third conductor 333). These three conductors 330 form a 3-layered stack between first outer dielectric 310 and second outer dielectric 320 and are supported by inner dielectic 340. However, as noted above, flexible multilayered interconnect circuit 300 can have any number of conductors, which may be also referred to as a conductive layer.

Figure 7B:
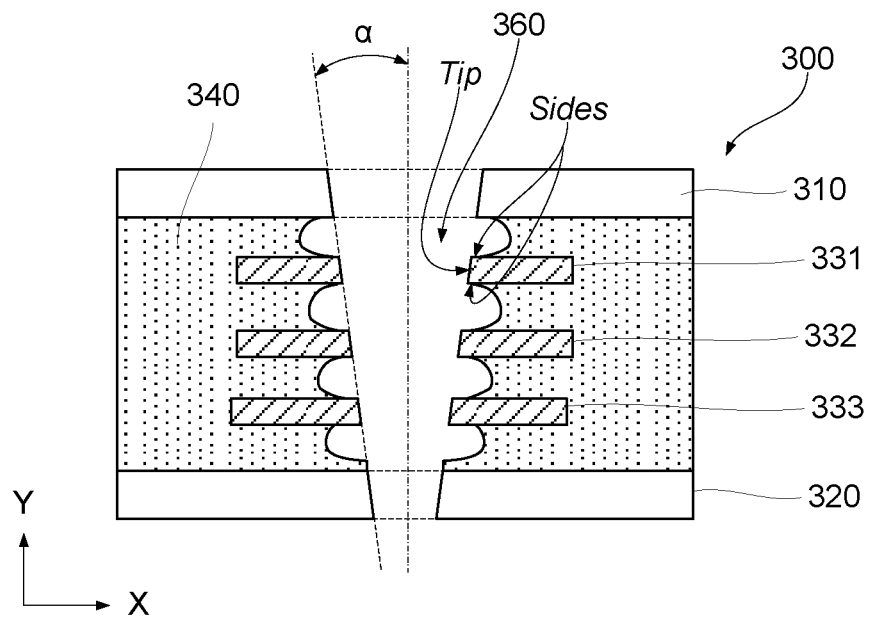
Figure 7C:
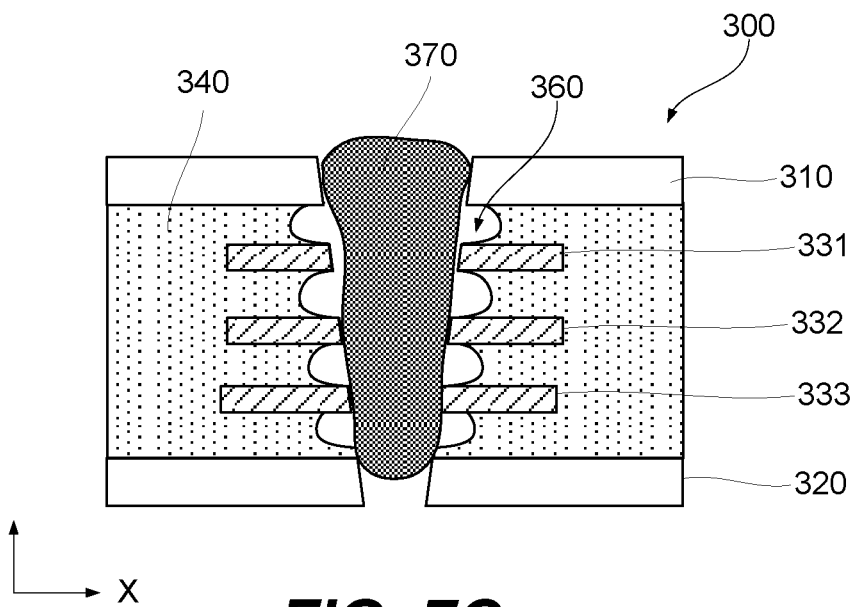

Method 600 proceeds with (block 620) forming opening 360 in multilayered interconnect circuit 300 as e.g. is schematically shown in FIG. 7B. Opening 360 is formed using various techniques, such as etching, die-cutting, and laser cutting. In some examples, opening 360 is formed through all dielectric (e.g., first outer dielectric 310, second outer dielectric 320, internal dielectric) and all conductors 330. In other words, opening 360 is a through-hole. The through-hole may be used for access to opening 360 from both sides of flexible multilayered interconnect circuit 300. Furthermore, when a connecting pin extends through multilayered interconnect circuit 300 and from each side of circuit 300, electrical connections may be formed to the connecting pin on both sides of circuit 300 (in addition to the internal connection between one or more conductors 330 and the connecting pin). Alternatively, opening 360 is a blind/closed-end hole as, e.g., is shown in FIGS. 7E and 7F. For example, at least a portion of one outer dielectric is preserved. While FIGS. 7E and 7F illustrate opening 360 through all conductors, one having ordinary skill in the art would understand that a blind hole may terminate while passing through less than all conductor layers. For example, a blind hole may pass through only one conductor or no conductors at all. It should be also noted that, in some examples, an electrical connection can be formed to a conductor even through opening 360 stops at this conductor (at the surface of this conductor) and does not protrude through the conductor.

In some examples, opening 360 is a tapered hole as e.g. is schematically shown in FIG. 7B. The taper (angle α in FIG. 7B) may be between about 5° and 30° from the Y-axis or, more specifically, between 5° and 15°. The taper simplifies the insertion and distribution of a solder paste within opening 360. Furthermore, the shape of opening 360 may be such that a portion of inner dielectric 340 may be pulled back away from the tips of conductors 330 extending into opening 360. As such, not only the tips of conductors 330 are exposed but also portions of the sides extending to these tips as, e.g., is schematically shown in FIG. 7B. This exposure of the sides provides an additional interface area for forming electrical connections to conductors. In some examples, the length of these exposed side portions is up to 0.5 millimeters, up to 1.0 millimeters, or even up to 2.0 millimeters.

Figure 7D:
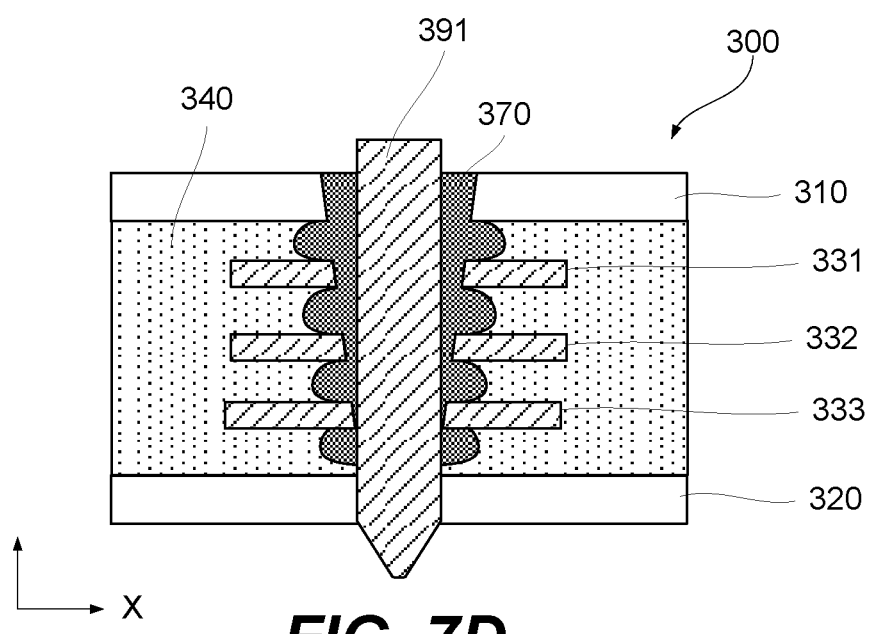
Figure 7E:
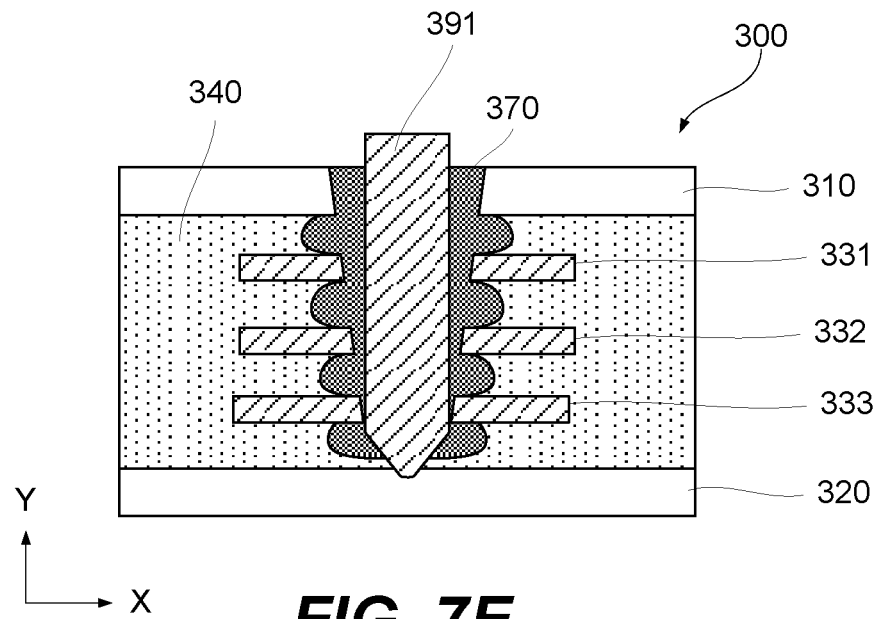
Figure 7F:
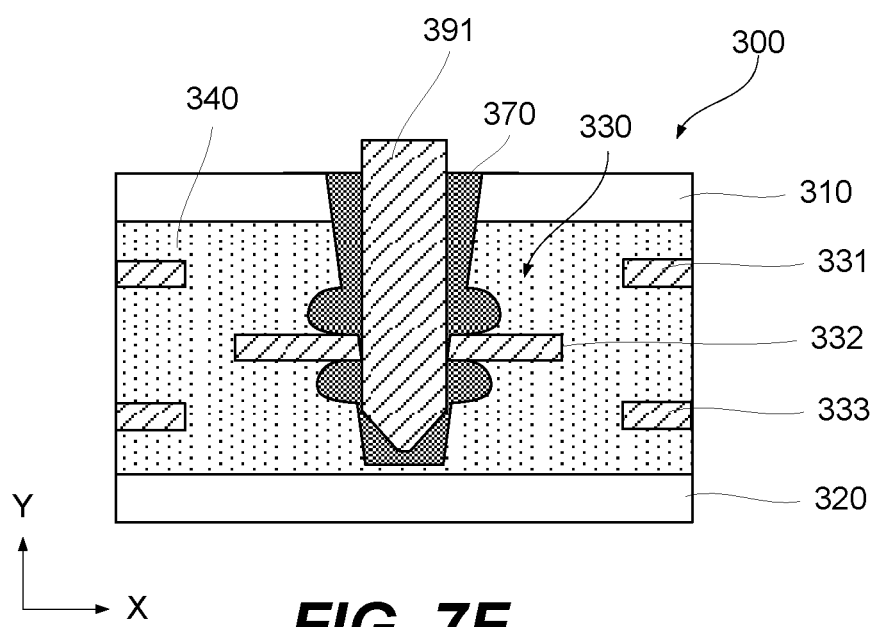

Method 600 proceeds with (block 630) inserting connecting pin 391 into opening 360 and forming electrical connections with one or more conductors 330 within opening 360 as, e.g., is schematically shown in FIGS. 7D, 7E, and 7F. These connections to conductors 330 may be referred to as internal connections to differentiate from external connections, which may be formed by connecting pin 391 outside of circuit 300.

In some examples, this pin-inserting operation comprises (block 632) placing solder paste 370 into opening 360 (e.g., as shown in FIG. 7C) and then inserting connecting pin 391 through solder paste 370 (e.g., as shown in FIG. 7D). When connecting pin 391 is inserted through solder paste 370, solder paste 370 is distributed through opening 360, filling the various cavities and surrounding exposed portions of conductors 330. In some examples, solder paste 370 comprises an oxidant removal, which helps to form direct electrical connections with the metal of conductors 330 by removing any surface oxides. In some examples, connecting pin 391 also forms direct contact with one or more conductors. For example, FIG. 7D illustrates third conductor 333 directly contacting connecting pin 391. It should be noted that an additional electrical connection can be provided by solder paste 370 even when a conductor directly contacts connecting pin 391. Referring to FIG. 7D, the remaining conductors are electrically connected to connecting pin 391 through solder paste 370.

FIG. 7E illustrates another example of flexible multilayered interconnect circuit 300 with connecting pin 391 not extending through the entire circuit 300. In this example, second outer dielectric 320 remained substantially intact. This example may be used for mounting second outer dielectric 320 on another surface, e.g., a car panel. Second outer dielectric 320 provides electrical and environmental insulation of connecting pin 391 and conductors.

FIG. 7F illustrates another example of flexible multilayered interconnect circuit 300 in which only one of three conductors is connected to connecting pin 391. Specifically, second conductor 332 is connected to connecting pin 391 while first conductor 331 and third conductor 333 remain electrically isolated from connecting pin 391. This isolation is achieved by specific patterning of conductors 330, e.g., during fabrication of flexible multilayered interconnect circuit 300. Specifically, first conductor 331 and third conductor 333 are patterned in a way that these conductors do not extend to the area where opening 360 is later formed. Second conductor 332 is patterned to extend to this area. When opening 360 is formed, the edges of first conductor 331 and third conductor 333 are positioned away from opening 360. Thereafter, neither solder paste 370 nor connecting pin 391 come in contact with first conductor 331 and third conductor 333.

Examples of Connecting Flexible Interconnect Circuits to Printed Circuit Boards

In some examples, one or more flexible interconnect circuits are connected to other components, such as a printed circuit board (PCB), electronic control unit (ECU), and the like. While the following description focuses on circuit connections to PCBs, one having ordinary skill in the art would recognize that any other electric and/or electronic components are within the scope. These components may be powered and/or controlled by electrical currents passing through flexible interconnect circuits.

In these examples, the connection between a flexible interconnect circuit and a PCB involves the electrical coupling of the circuit's conductive element to the PCB conductor without using additional conventional socket-type connectors, which are costly, occupy space, and require multiple additional connections between various components. One challenge associated with this electrical coupling, at least when this electrical coupling is established by direct welding of the circuit conductive element and the PCB conductor, is the thickness difference of these two components. For example, the PCB conductor thickness can be between 35 micrometers and 70 micrometers (e.g., a thin plated copper layer). The thickness of the circuit conductive element can be between 35 micrometers and 250 micrometers (e.g., a copper foil). In specific examples, the circuit conductive element is at least twice thicker, three times thicker, or even four times thicker than the PCB conductor. In some examples, the circuit conductive element and the PCB conductor are formed from different materials, which further complicates the direct bonding of these components. For example, the circuit conductive element is formed from aluminum because of its low weight and costs. The PCB conductor can be formed copper, electroplates on the PCB board, which may be also referred to as a PCB base. Finally, the PCB conductor can conform to the PCB base, which further complicates any direct bonding.

Figure 8A:
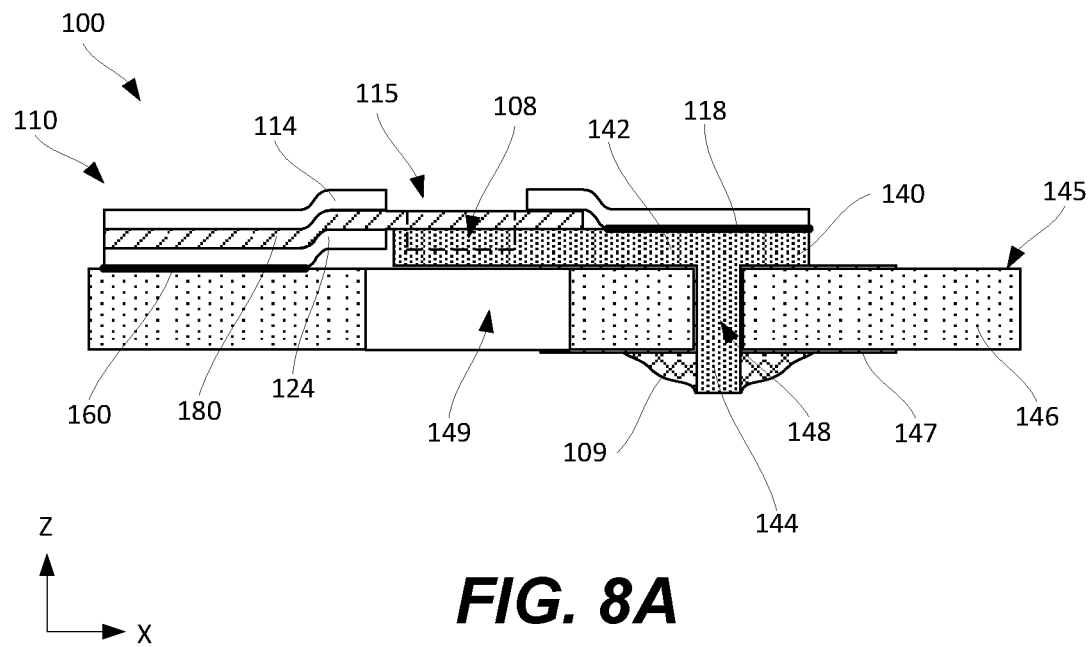
FIGS. 8A and 8B are schematic cross-sectional views of flexible interconnect circuits connected to printed circuit boards using conductor-joining structures, in accordance with one or more embodiments.
Figure 8B:
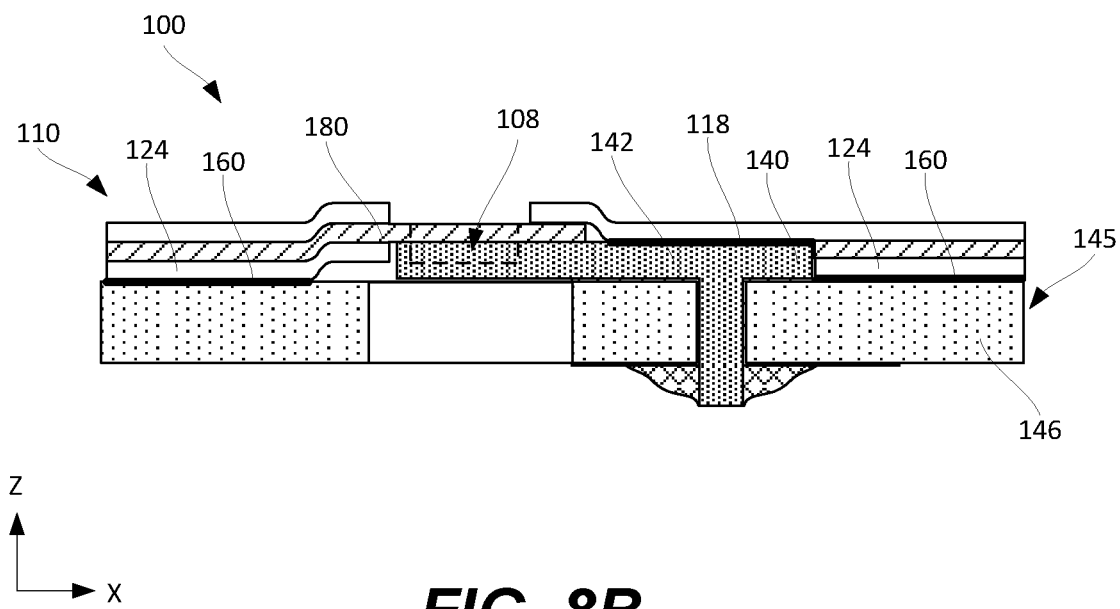

Referring to FIGS. 8A and 8B, in some examples, circuit assembly 100 comprises conductor-joining structure 140, which interconnects PCB 145 and flexible interconnect circuit 110. PCB 145 comprises PCB base 146 and PCB conductive layer 147, disposed on and support by PCB base 146. PCB conductive layer 147 is patterned to provide various connections within PCB 145. In some examples, the pattern of PCB conductive layer 147 is formed by selective etching a continuous metal layer formed over PCB base 146. In some examples, PCB base 146 comprises PCB opening 148, which can be a through-hole as, e.g., shown in FIG. 8A. PCB conductive layer 147 can extend through PCB opening 148 (e.g., lining up the walls of PCB opening 148) and positioned on both sides of PCB base 146.

Flexible interconnect circuit 110 comprises conductive element 180, which can be disposed between first outer dielectric 114 and second outer dielectric 124. A portion of conductive element 180 extends past at least one or both first outer dielectric 114 and second outer dielectric 124 to form an electrical connection with PCB conductive layer 147. Referring to FIG. 8A, first outer dielectric 114 comprises dielectric opening 115, which provides access to a portion of conductive element 180 on one side. In this example, second outer dielectric 124 does not extend into the contact area. In some examples, flexible interconnect circuit 110 is bonded to PCB 145 using assembly adhesive 160, e.g., disposed between second outer dielectric 124 and PCB base 146. Assembly adhesive 160 provides additional mechanical support between flexible interconnect circuit 110 and PCB 145.

Circuit assembly 100 also comprises conductor joining structure 140, used for electrical connection between conductive element 180 of flexible interconnect circuit 110 and PCB conductive layer 147. Referring to FIG. 8A, conductor joining structure 140 comprises plate 142, which extends adjacent to one side of PCB 145. In some examples, plate 142 directly contacts and forms an electrical connection to PCB conductive layer 147 disposed on this side of PCB 145. The thickness of plate 142 (measured along the Z-axis) can be comparable to that of conductive element 180. In some examples, the ratio of the plate thicknesses to the conductive element thickness is between 3:1 and 1:30 or, more specifically, between 2:1 and 1:2 or even between 1.5:1 and 1:1.5. The comparable thickness helps with bonding of plate 142 and conductive element 180. Furthermore, in some examples, the material of plate 142 and conductive element 180 are the same or at least conductive element 180 and the portion of plate 142 that contact conductive element 180. Additional materials considerations are described below with reference to FIGS. 11A-11C.

Referring to FIG. 8A, in some examples, conductor joining structure 140 comprises protrusion 144, extending into PCB opening 148. In more specific examples, protrusion 144 extends through PCB base 146 and can be used to form electrical connections to PCB conductive layer 147 disposed on the other side of PCB base 146 (relative to plate 142). For example, FIG. 8A illustrates solder 109 positioned on the surface of PCB conductive layer 147 and surrounding protrusion 144. A combination of protrusion 144 and PCB opening 148 also supports conductor joining structure 140 relative to PCB 145. In some examples, at least a portion of conductor joining structure 140 is adhered to flexible interconnect circuit 110. For example, FIG. 8A illustrates first outer dielectric 114 extending over a portion of plate 142 and adhered to plate 142 using first dielectric adhesive 118.

In some examples, conductor joining structure 140 is directly welded, soldered, or otherwise electrically coupled to conductive element 180. Various forms of welding (e.g., ultrasonic welding, resistance welding, and laser welding) are within the scope. When welding is used, weld zone 108 is formed at the interface of conductor joining structure 140 and conductive element 180. In some examples, a conductive adhesive is used to form an electrical connection between conductor joining structure 140 and conductive element 180. In some examples, the surfaces of conductor joining structure 140 and conductive element 180, facing away from the contact interface, are accessible to assist with forming this contact interface. For example, PCB base 146 can include access opening 149, exposing at least a portion of the side of plate 142 facing away from the contact interface. Similarly, first outer dielectric 114 comprises dielectric opening 115 exposing a portion of the side conductive element 180, which also faces away from the contact interface.

Referring to FIG. 8B, in some examples, flexible interconnect circuit 110 extends on both sides of the contact interface between conductor joining structure 140 and conductive element 180. A portion of conductive element 180 forms a tab, which extends (e.g., out of the plane) and over plate 142 of conductor joining structure 140. In some examples, conductive element 180 is continuous and extends on all sides of the contact interface. In other words, a connection to a PCB can be made anywhere along the length of conductive element 180.

Figure 9A:
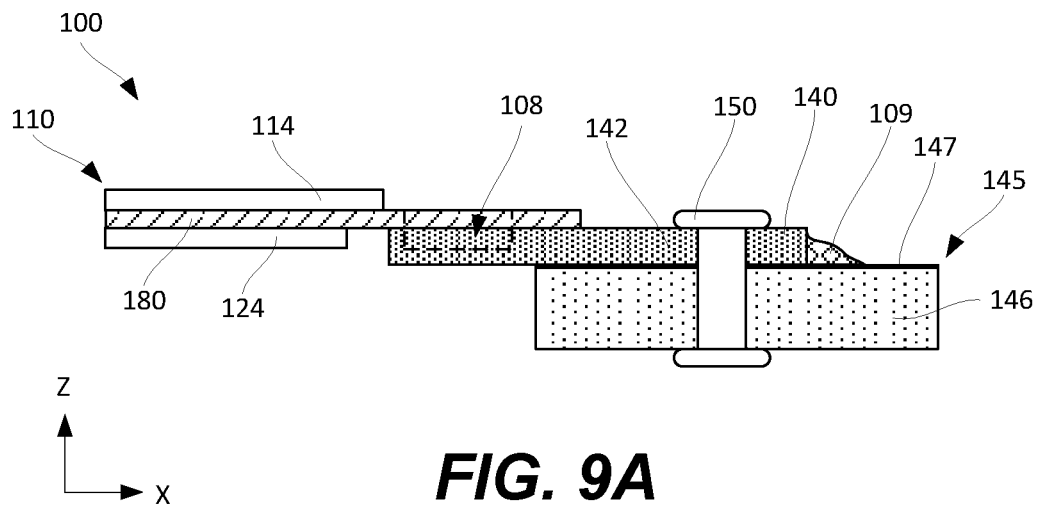
FIGS. 9A and 9B are schematic cross-sectional and top views of a conductor-joining structure connected to a printed circuit board using a supporting structure, such as rivets, in accordance with one or more embodiments.
Figure 9B:
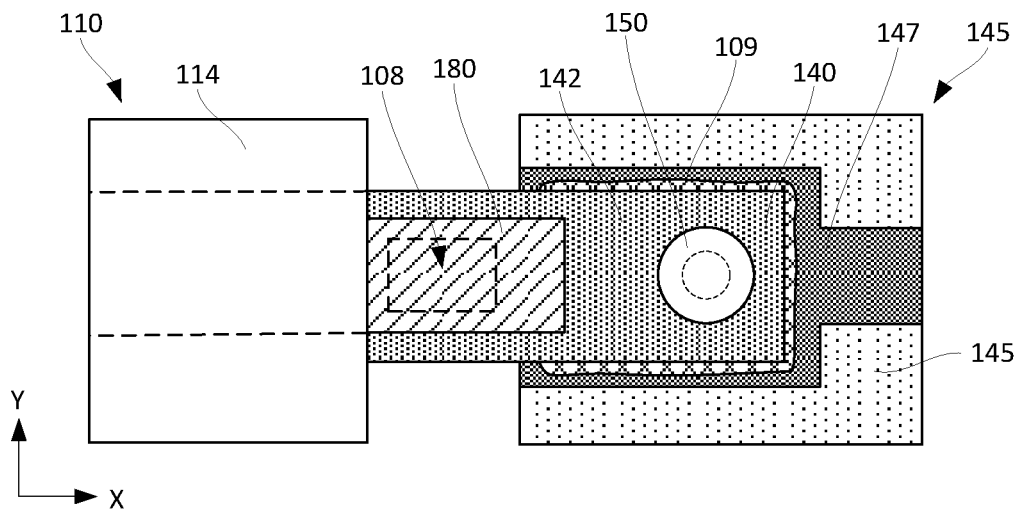

Referring to FIGS. 9A and 9B, in some examples, conductor joining structure 140 is connected to PCB 145 using support structure 150, such as a rivet. For example, support structure 150 can provide mechanical attachment. Support structure 150 can also force plate 142 against PCB conductive layer 147 thereby forming an electrical connection between conductor joining structure 140 and PCB conductive layer 147 through direct contact. Additional electrical and mechanical connections can be provided by solder 109, e.g., disposed around the perimeter of plate 142. In some examples, support structure 150 can be used for attaching flexible interconnect circuit 110 to conductor joining structure 140 like the ones described above with reference to FIGS. 1A-1F.

Figure 10A:
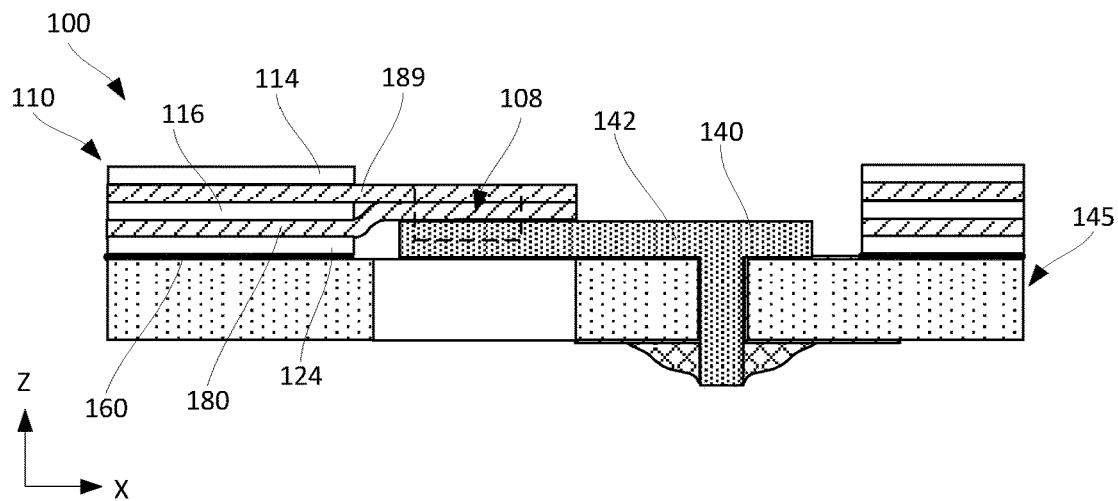
FIGS. 10A, 10B, and 10C are schematic cross-sectional views of flexible multilayered interconnect circuits connected to printed circuit boards using conductor-joining structures, in accordance with one or more embodiments.
Figure 10B:
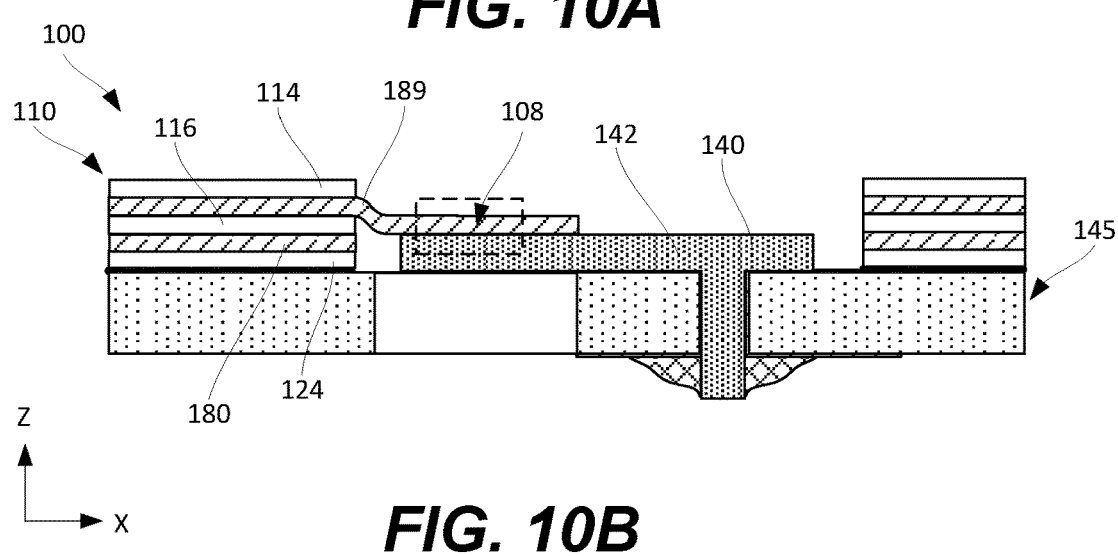
Figure 10C:
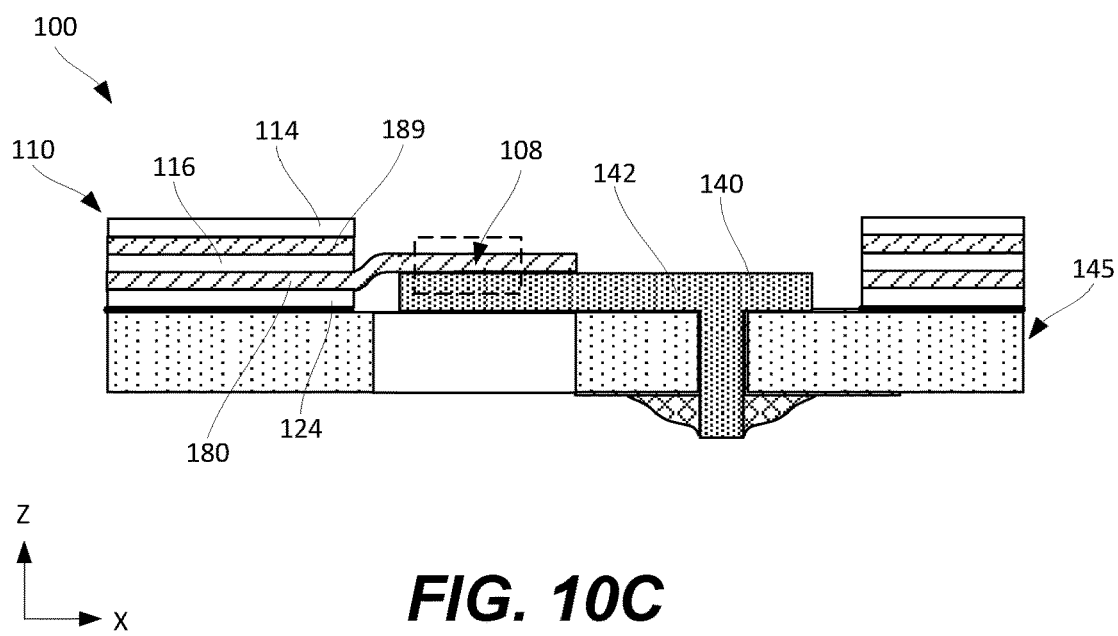

Referring to FIGS. 10A, 10B, and 10C, in some examples, flexible interconnect circuit 110 is a flexible multilayered interconnect circuit. Some examples of flexible multilayered interconnect circuits are described above with reference to FIGS. 3 and 7A. In these examples, flexible interconnect circuit 110 further comprises additional conductive element 189 and inner dielectric 116, e.g., disposed between conductive element 180 and additional conductive element 189. Either one or both of conductive element 180 and additional conductive element 189 can be connected to conductor joining structure 140 as shown in FIGS. 10A, 10B, and 10C. Specifically, FIG. 10A illustrates an example in which both conductive element 180 and additional conductive element 189 are connected to conductor joining structure 140. In this example, conductive element 180 and additional conductive element 189 protrudes past all dielectrics and overlap with at least a portion of conductor joining structure 140 or, more specifically, with plate 142 of conductor joining structure 140. In this example, conductive element 180 is positioned between and contacts both additional conductive element 189 and plate 142. All three elements (additional conductive element 189, conductive element 180, and plate 142) form weld zone 108. FIG. 10B illustrates an example in which additional conductive element 189 is connected to conductor joining structure 140 but not conductive element 180. It should be noted that within flexible interconnect circuit 110, conductive element 180 is positioned closer to PCB 145 than additional conductive element 189. FIG. 10C illustrates another example in which conductive element 180 is connected to conductor joining structure 140 but not additional conductive element 189.

Figure 11A:
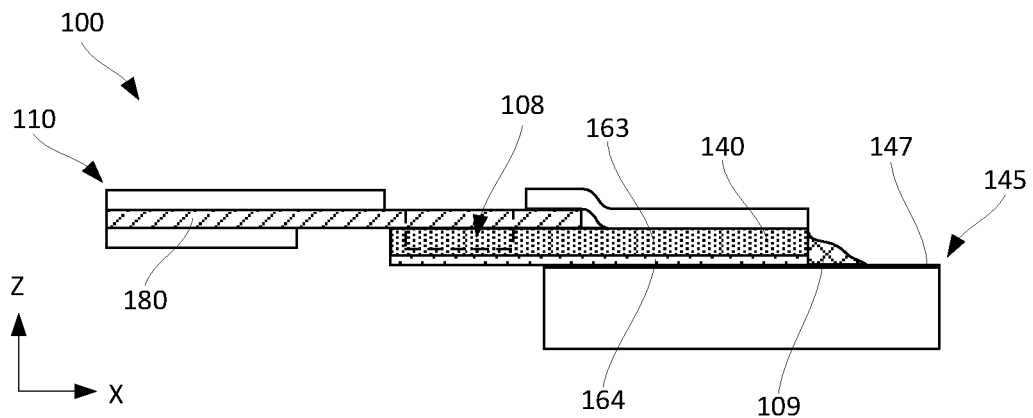
FIGS. 11A, 11B, and 11C are schematic cross-sectional views of different conductor-joining structures comprising two portions formed from different materials, in accordance with one or more embodiments.
Figure 11B:
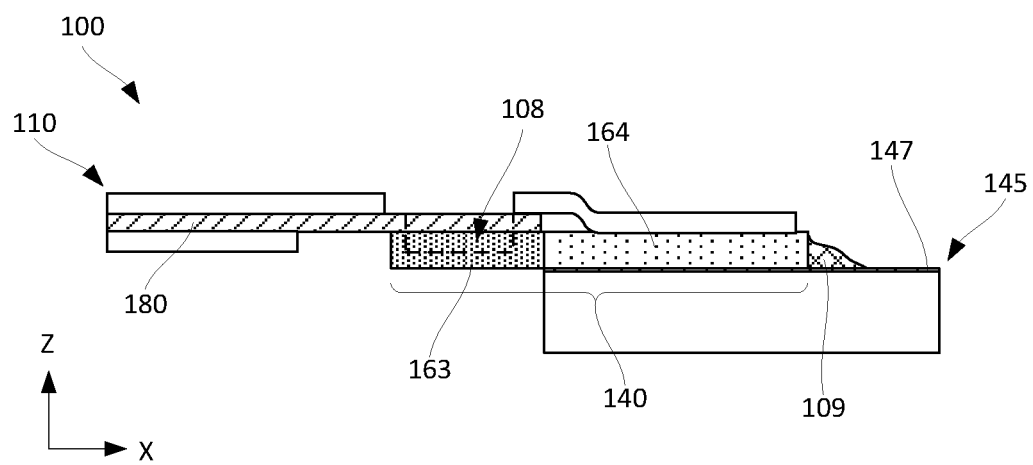
Figure 11C:
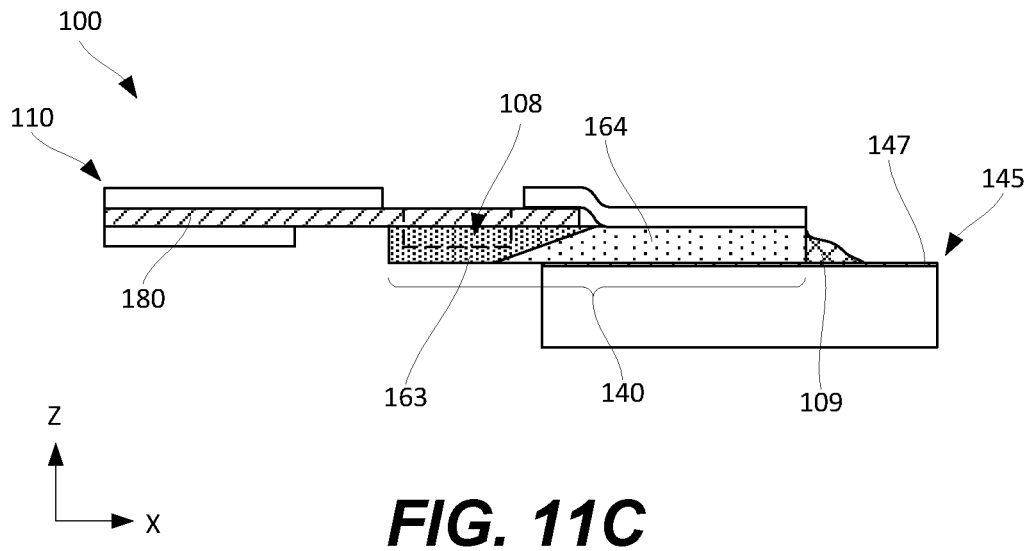

In some examples, conductor joining structure 140 is a monolithic structure formed from the same conductive material such as metal (e.g., copper, aluminum). Alternatively, conductor joining structure 140 comprises two parts formed from different conductive materials. Referring to FIGS. 11A, 11B, and 11C, conductor joining structure 140 comprises first portion 163 and second portion 164 such that the composition/material of first portion 163 is different from the composition/material of second portion 164. First portion 163 interfaces and electrically coupled (e.g., welded, soldered, adhered) to conductive element 180 while second portion 164 interfaces and electrically coupled (e.g., welded, soldered, adhered) to PCB conductive layer 147. As such, the material of first portion 163 can be selected to assist with forming the connection conductive element 180. For example, it is easier to weld the same materials. In some examples, both first portion 163 and conductive element 180 are formed from the same material (e.g., aluminum). In the same or other examples, second portion 164 and PCB conductive layer 147 are formed from the same material (e.g., copper).

Referring to FIG. 11A, in some examples, first portion 163 and second portion 164 for a stack along the Z-axis, which is also the stacking direction for conductive element 180 and conductor joining structure 140. For example, first portion 163 and second portion 164 form a metal-clad. In this example, first portion 163 faces and contacts conductive element 180, while second portion 164 faces and contacts PCB conductive layer 147.

Referring to FIG. 11B, in some examples, first portion 163 and second portion 164 are stacked along X-axis, which is parallel to the primary plane of flexible interconnect circuit 110 or the surface of PCB 145. First portion 163 can overlap and contact conductive element 180, while second portion 164 can overlap and contact PCB conductive layer 147. Referring to FIG. 11C, in some examples, the interface between first portion 163 and second portion 164 is not parallel to either the Z-axis or the X-axis, but rather extends between these two axes. This approach allows increasing the overlap areas between first portion 163 and conductive element 180 and, separately, between second portion 164 and PCB conductive layer 147.

CONCLUSION

Although the foregoing concepts have been described in some detail for purposes of clarity of understanding, it will be apparent that certain changes and modifications may be practiced within the scope of the appended clauses. It should be noted that there are many alternative ways of implementing the processes, systems, and apparatus. Accordingly, the present examples are to be considered illustrative and not restrictive.

What is claimed is:

1. A circuit assembly comprising:
   a first flexible interconnect circuit, comprising a first partially-outer dielectric and a first conductive element, wherein the first conductive element comprises a first inner-facing side, a first outer-facing side opposite to the first inner-facing side, and a first edge extending between the first inner-facing side and the first outer-facing side;
   a second flexible interconnect circuit, comprising a second conductive element, wherein:
      the second conductive element comprises a second inner-facing side, a second outer-facing side opposite to the second inner-facing side, and a second edge extending between the second inner-facing side and the second outer-facing side,
      the first outer-facing side and the second outer-facing side face away from each other, and
      the first partially-outer dielectric is disposed between the first conductive element and the second conductive element; and
   a rivet, wherein:
      the rivet protrudes through each of the first conductive element, the first partially-outer dielectric, and the second conductive element,
      the rivet comprises a first head, a second head, and a stem extending between the first head and the second head,
      the rivet electrically interconnects the first conductive element and the second conductive element by (a) the first outer-facing side directly contacting the first head of the rivet and forming a first contact interface with the first head and (b) the second outer-facing side directly contacting the second head of the rivet and forming a second contact interface with the second head, and
      the rivet compresses the first conductive element and the second conductive element toward each other.

2. The circuit assembly of claim 1, wherein:
   the stem of the rivet directly contacts the first conductive element, and
   the stem of the rivet directly contacts the second conductive element.

3. The circuit assembly of claim 1, wherein:
   the first flexible interconnect circuit further comprises a first outer dielectric such that the first conductive element is disposed between the first partially-outer dielectric and the first outer dielectric,
   the first outer dielectric comprises a first-outer-dielectric opening, and
   at least a portion of the first head of the rivet protrudes through the first-outer-dielectric opening, directly contacting and forming the first contact interface with the first outer-facing side of the first conductive element.

4. The circuit assembly of claim 3, wherein the first partially-outer dielectric comprises a first-partially-outer-dielectric opening having a smaller cross-sectional area than the first-outer-dielectric opening.

5. The circuit assembly of claim 4,
   further comprising an assembly adhesive, bonding the first flexible interconnect circuit to the second flexible interconnect circuit, such that the rivet further protrudes through the assembly adhesive, and
   wherein the second flexible interconnect circuit further comprises a second partially-outer dielectric, disposed between the second conductive element and the first partially-outer dielectric and bonded to the first partially-outer dielectric by the assembly adhesive.

6. The circuit assembly of claim 1, wherein:
   the second flexible interconnect circuit further comprises a second outer dielectric such that the second conductive element is disposed between the second outer dielectric and the first partially-outer dielectric, the second outer dielectric comprises a second-outer-dielectric opening, at least a portion of the second head of the rivet protrudes through the second-outer-dielectric opening, directly contacting and forming the second contact interface with the second outer-facing side of the second conductive element.

7. The circuit assembly of claim 1, wherein the second contact interface is not parallel to the first contact interface.

8. The circuit assembly of claim 7, wherein an angle between the second contact interface and the stem of the rivet is less than 90°.

9. The circuit assembly of claim 1, wherein the rivet comprises an opening extending through the first head and at least a portion of the stem.

10. The circuit assembly of claim 9, wherein the opening of the rivet is a through opening, further extending through the second head.

11. The circuit assembly of claim 9, further comprising an external connector, extending into the opening of the rivet and electrically coupled by the rivet to each of the first conductive element and the second conductive element.

12. The circuit assembly of claim 11, wherein the external connector is soldered in the opening of the rivet.

13. The circuit assembly of claim 11, wherein the external connector comprises a press-fit pin, inserted into the opening of the rivet.

14. The circuit assembly of claim 11, wherein the external connector is adhered to the first flexible interconnect circuit.

15. A method of forming a circuit assembly, the method comprising:
  providing a first flexible interconnect circuit, comprising a first partially-outer dielectric and a first conductive element, wherein:
    the first partially-outer dielectric comprises a first-partially-outer-dielectric opening, and
    the first conductive element comprises a first-conductive-element opening,
    a first inner-facing side, a first outer-facing side opposite to the first inner-facing side, and a first edge extending between the first inner-facing side and the first outer-facing side;
  providing a second flexible interconnect circuit, comprising a second conductive element, wherein the second conductive element comprises a second-conductive-element opening a second inner-facing side, a second outer-facing side opposite to the second inner-facing side, and a second edge extending between the second inner-facing side and the second outer-facing side, and
  bonding the first flexible interconnect circuit to the second flexible interconnect circuit while maintaining the first-conductive-element opening concentric with the second-conductive-element opening and while the first partially-outer dielectric is disposed between the first conductive element and the second conductive element, wherein the first outer-facing side and the second outer-facing side face away from each other;
  inserting a rivet through the first-conductive-element opening, the first-partially-outer-dielectric opening, and the second-conductive-element opening; and
  securing the rivet in the first-conductive-element opening, the first-partially-outer-dielectric opening, and the second-conductive-element opening, wherein:
    the rivet comprises a first head, a second head, and a stem extending between the first head and the second head,
    the rivet electrically interconnects the first conductive element and the second conductive element by (a) the first outer-facing side directly contacting the first head of the rivet and forming a first contact interface with the first head and (b) the second outer-facing side directly contacting the second head of the rivet and forming a second contact interface with the second head, and
    the rivet compresses the first conductive element and the second conductive element toward each other.

16. The method of claim 15, further comprising attaching an external connector to the rivet.

17. The method of claim 16, wherein attaching the external connector to the rivet comprises protruding a pin of the external connector into an opening of the rivet.

18. The method of claim 17, wherein attaching the external connector to the rivet further comprises soldering the pin of the external connector within the opening of the rivet.

19. The method of claim 15, further comprising electrically insulating one or ends of the rivet.

20. The method of claim 15, wherein, after securing the rivet:
  the stem of the rivet directly contacts the first conductive element, and
  the stem of the rivet directly contacts the second conductive element.

* * * * *